(12) United States Patent
Yamashita et al.

(10) Patent No.: US 6,870,244 B2
(45) Date of Patent: *Mar. 22, 2005

(54) LEAD FRAME AND PRODUCTION PROCESS THEREOF AND PRODUCTION PROCESS OF THERMALLY CONDUCTIVE SUBSTRATE

(75) Inventors: Yoshihisa Yamashita, Kyoto (JP); Koichi Hirano, Hirakata (JP); Seiichi Nakatani, Hirakata (JP); Masaki Suzumura, Hisai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 179 days.

This patent is subject to a terminal disclaimer.

(21) Appl. No.: 10/026,522

(22) Filed: Dec. 27, 2001

(65) Prior Publication Data

US 2002/0187318 A1 Dec. 12, 2002

(30) Foreign Application Priority Data

Dec. 27, 2000 (JP) ........................................ 2000-397650
Dec. 27, 2000 (JP) ........................................ 2000-397651

(51) Int. Cl.$^7$ .............................................. H01L 23/48
(52) U.S. Cl. ....................................................... 257/668
(58) Field of Search ................................ 257/666, 668, 257/669, 712, 701, 702, 788, 789, 795

(56) References Cited

U.S. PATENT DOCUMENTS 6,060,150 A * 5/2000 Nakatani et al. ............ 428/209
6,329,045 B1 * 12/2001 Hirano et al. ................ 428/209
6,522,555 B2 * 2/2003 Hirano et al. ................ 361/760
6,548,152 B2 * 4/2003 Nakatani et al. ............. 428/209
6,570,099 B1 * 5/2003 Hirano et al. ................ 174/258

FOREIGN PATENT DOCUMENTS

| JP | 9-298344 | 11/1997 |
| JP | 9-321395 | 12/1997 |
| JP | 10-173097 | 6/1998 |

OTHER PUBLICATIONS

US application Ser. No. 10/313,534, Nakatani et al.*

US application Ser. No. 09/956,208, Hirano et al.*

* cited by examiner

Primary Examiner—David A. Zarneke
(74) Attorney, Agent, or Firm—Wenderoth, Lind & Ponack L.L.P.

(57) ABSTRACT

A thermally conductive substrate includes a thermally conductive resin sheet member attached to a lead frame. The lead frame comprises a thermally conductive resin sheet member and it is integrated with the thermally conductive resin sheet member on the lead frame. The thermally conductive resin sheet member is formed from a thermosetting resin mixture comprises 70 to 90 parts by weight of an inorganic filler and 5 to 30 parts by weight of a thermosetting resin composition including a thermosetting resin, and the thermosetting resin is in a semi-cured state.

14 Claims, 9 Drawing Sheets

(a)

(a)

(b)

(c)

(d)

(a)

(b)

(c)

(d)

LEAD FRAME AND PRODUCTION PROCESS THEREOF AND PRODUCTION PROCESS OF THERMALLY CONDUCTIVE SUBSTRATE

CROSS-REFERENCE TO RELATED APPLICATIONS

The present application claims priorities under 35 U.S.C. §119 to Japanese Patent Application No. 2000-397650 filed on Dec. 27, 2000 entitled "Thermally conductive resin sheet attaching lead frame and production process thereof and production process of thermally conductive substrate using the same", and Japanese Patent Application No. 2000-397651 filed on Dec. 27, 2000 entitled "Sheet amount control means and production process of substrate." The contents of those applications which are relevant to the inventions of the present application are incorporated herein by the references thereto in their entireties.

BACKGROUND OF THE INVENTION

The present invention relates to a circuit board with which heat dissipation is improved by means of a mixture of a resin and an inorganic filler. Particularly, the present invention relates to a resin substrate having a high heat dissipation (i.e. a thermally conductive substrate) which is used for mounting power electronics devices. More particularly, the present invention relates to a thermally conductive substrate and a lead frame which comprises a thermally conductive resin sheet member and which is used for the production of the thermally conductive substrate, and production processes of such substrate and such lead frame.

RELATED ART

Recently, as high performance and miniaturization of an electronic apparatus have been required, a high density and high performance semiconductor device has been sought. Consequently, a circuit board for mounting such a device has also been required to be small and of a high density. As a result, it has been important to design a circuit board while considering the heat dissipation (or heat radiation) property.

As opposed to using a conventional printed circuit board made of a glass-epoxy resin, providing a metal base substrate is known as a technique for improving the heat dissipation property of the circuit board. In particular, a metal plate of, for example, aluminum is used, and a circuit pattern is placed on an intermediate insulation on one side of the metal plate. Moreover, when higher thermal conductivity is required, a substrate is used wherein a copper plate is directly bonded to a ceramic substrate made of, for example, alumina or aluminum nitride.

For an application requiring relatively small electric power, the metal base substrate is generally used. In this case, in order to improve the thermal conduction, the insulation must be thin. However, there occur problems in that a noise effect occurs between the metal base substrates and a break down voltage is low. Further, there is a problem in that a cost of the ceramic substrate is expensive.

It is difficult for the metal base substrate and the ceramic substrate to satisfy both the performance and the cost requirements as described above. A thermally conductive module made by injection molding has been suggested wherein a thermoplastic resin composition containing an inorganic filler is integrated with a lead frame as an electrode (see for example Japanese Patent Kokai Publication Nos. 9-298344 and 9-321395).

Such a thermally conductive module made by injection molding has an excellent mechanical strength in comparison with the ceramic substrate. However, it is difficult to load the thermoplastic resin with the inorganic filler in a large content thereof so as to provide the resin with the heat dissipation property, which leads to a bad heat dissipation property. This is because the large content of the filler results in rapid viscosity increase of the thermoplastic resin when it is mixed with the filler at a high temperature, so that it also becomes impossible to carry out not only kneading the resin but also the injection molding. Moreover, the loaded filler serves as an abrasive to abrade a metal mold, which makes it difficult to repeat the molding many times. Consequently, there is a problem in that a content of the filler is limited, so that only lower thermal conductivity can be obtained as compared with the thermal conductivity of the ceramic substrate.

In order to solve the above problems, Japanese Patent Kokai Publication No. 10-173097 discloses a thermally conductive substrate in which a lead frame and a metal heat dissipation plate are arranged to opposed to each other. A production process of substrate producing a thermally conductive resin sheet member which is loaded with an inorganic filler at a high content by the formation of a sheet member from a mixture of a thermosetting resin which is flexible in its semi-cured (or semi-hardened) state and the inorganic filler which provides better thermal conductivity (which mixture is also referred to as a "thermosetting resin mixture"), and stacking a lead frame as an electrode and a heat dissipation metal plate so that they sandwich the sheet member, followed by thermally pressing them so as to fill the lead frame up to its surface with the thermally conductive resin sheet member while it is cured. The lead frame, the thermally conductive resin sheet member and the heat dissipation metal plate are integrated together. It is noted that the contents of the Patent Publication are incorporated herein by the reference thereto in their entireties.

When the thermally conductive substrate is produced using the above described process, the thermosetting resin mixture may overflow onto a periphery of an exposed surface of the heat dissipation metal plate, and a periphery of an exposed surface of the lead frame and curing of such thermosetting resin mixture forms resin burrs and surface stains. The burrs and the surface stains cause an inconvenience in soldering upon mounting parts onto the thermally conductive substrate and also they are not preferable from a viewpoint of appearance of the thermally conductive substrate. Thus, an additional step is required to remove the burrs and the stains.

When the thermally conductive resin sheet member is produced using the above described process, there occurs a fluctuation of the thermosetting resin mixture itself and various changes of steps, so that it is not easy to stably produce the thermally conductive resin sheet members each having a predetermined thickness (and thus its predetermined volume).

Particularly, when the thermally conductive resin sheet member is excessively thick, and thus too large, an amount of the thermosetting resin mixture which overflows onto the periphery of the lead frame becomes larger, so that the burrs and the stains formed on the lead frame increase. Also, when the volume of the thermally conductive resin sheet member is fluctuated, a thickness of the thermally conductive substrate finally produced is fluctuated so that no stable supply of the substrate may become possible. That is, in order to stably produce the thermally conductive substrate, it is necessary to produce an appropriate thermally conductive resin sheet member stably.

On the other hand, when the thermally conductive substrate is produced using the above described process, the thermally conductive resin sheet member made from the thermosetting resin which is flexible in its semi-hardened state does not necessarily have a sufficient mechanical strength, so that there is a problem in that handling of the thermally conductive resin sheet member is not easy. The thermally conductive resin sheet member is controlled to have a long gel time (for example, longer than four minutes) under the consideration of stable storage over an extended period. However, when a lead frame is integrated with such thermally conductive resin sheet member by curing the thermally conductive resin sheet member, there occurs problems not only of the formation of the resin burrs as described above but also of an extended cycle period for the integration due to the long curing time.

SUMMARY OF THE INVENTION

It is therefore an object of the present invention to provide improvement as to at least one of the various problems as described above as compared with what has been hitherto.

The present inventors have found that a thermally conductive resin sheet member reinforced by a lead frame by integrating the lead frame beforehand with the thermally conductive resin sheet member in which a thermosetting resin contained therein is in a semi-cured state, handling of the thermally conductive resin sheet member is improved. The inventors have also found that a thermally conductive substrate can be produced in an improved state as to at least one of the various problems described above when compared with the prior art by stacking a heat dissipation metal plate and the thermally conductive resin sheet member thus integrated with the lead frame followed by thermally pressing them.

Figure 1:
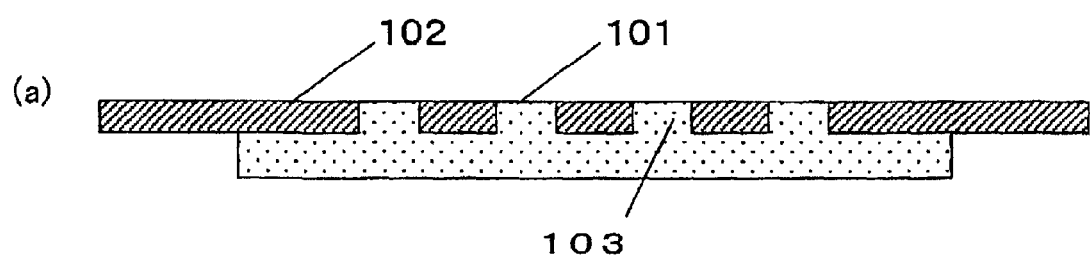
FIG. 1 schematically shows a cross-sectional view of one embodiment of a thermally conductive resin sheet member attached to a lead frame according to the present invention.

In the drawings, the reference numbers indicate the following members:

101, 201, 301, 401, 501, 601, 701 and 801 . . . thermally conductive resin sheet member;

102, 202, 502, 602, 702 and 802 . . . lead frame;

302, 402 and 503 . . . plate pair spaced apart a predetermined distance;

303 and 403 . . . thermally conductive resin sheet member having a predetermined thickness;

304 and 404 . . . thermally conductive resin sheet member having a controlled mass per unit area;

600 . . . independent terminal of a lead frame;

603 . . . through opening (or through hole);

604 . . . pin;

605 . . . die;

610 . . . outer frame portion;

612 . . . common terminal;

700 . . . thermally conductive resin sheet member attached to a lead frame; and 703 and 803 . . . heat dissipation metal plate;

DETAILED DESCRIPTION OF THE INVENTION

In the first aspect, the present invention provides a thermally conductive resin sheet member attached to a lead frame. The lead frame comprises a thermally conductive resin sheet member and it is integrated with the thermally conductive resin sheet member on the lead frame. The thermally conductive resin sheet member is formed from a thermosetting resin mixture which comprises 70 to 90 parts by weight of an inorganic filler and 5 to 30 parts by weight of a thermosetting resin composition comprising a thermosetting resin, and the thermosetting resin is in a semi-cured state.

When the amount of the inorganic filler in the thermosetting resin mixture is less than the above specific range, a substrate which is produced using the thermally conductive resin sheet member attached to the lead frame may be insufficient as to its heat dissipation. On the other hand, when such amount is larger than the above specific range, an adhesion property of the thermally conductive resin sheet member may be degraded, so that a sufficient substrate cannot be produced. It is noted that from a viewpoint of a further improvement of the thermally conductive resin sheet member in its thermal conductivity and its adhesion property, a particularly preferable weight ratio of the inorganic filler to the thermosetting resin composition is 85–95 to 15–5.

As to such thermally conductive resin sheet member attached to the lead frame, since the thermally conductive resin sheet member is integrated with the lead frame, the thermally conductive resin sheet member is reinforced so that cracks, breakage and the like thereof are unlikely to occur, which improves handling of the thermally conductive resin sheet member. It is noted that the term "integrate(d)" as used herein is readily understood by those skilled in the art, and means that the thermally conductive resin sheet member becomes bonded (especially an adhesion state sufficient for the application of the thermally conductive substrate to be produced) to another element such as a lead frame or a heat dissipation metal plate which will be described below due to properties inherent in the thermally conductive resin sheet member, such as properties when it is heated (including being heated for progressing the curing and being heated while suppressing the curing) and/or pressurized (or pressed) and properties when it is optionally cooled thereafter.

In the thermally conductive resin sheet member attaches to a lead frame according to the present invention, the thermally conductive resin sheet member is made from the thermosetting resin mixture, has an electrically insulating property and is able to function as an insulation layer. The thermosetting resin mixture is composed of the thermally conductive resin composition and the inorganic filler, and it includes a solvent (or diluent or dispersing agent) if necessary so as to adjust a viscosity of the thermosetting resin mixture. The thermally conductive resin composition includes the thermosetting resin as its main component.

As such a thermosetting resin, a thermosetting resin which is usually used for an electronic substrate and especially for electrical insulation application of the electronic substrate is preferable. At least one selected from a bisphenol A epoxy resin, a bisphenol F epoxy resin and a liquid phenol resin is more preferable, and also any combination thereof may be used. Using those resins is particularly preferable due to their excellent electric properties (in particular, an electrically insulating property) and mechanical properties (in particular, a mechanical strength).

In addition, the thermally conductive resin composition may further include other component(s). As such other component(s), an curing (or hardening) agent and/or a curing (or hardening) accelerator is preferable. As the curing agent, a bisphenol A novolac resin may be used, and as the hardening accelerator, an imidazole may be used. Additionally, the thermally conductive resin composition may further include an additive such as a coupling agent, a dispersing agent, a coloring agent and a release agent. These additives are not particularly limited, and they are optionally selected. As the coupling agent, an epoxy-silane based coupling agent, an amino-silane based coupling agent and a titanate based coupling agent may be used. As the dispersing agent, a phosphate may be used. As the coloring agent, carbon black and chromium oxide may be used. As the release agent, a silicone resin may be used.

The inorganic filler which is contained in the thermosetting resin mixture (namely, thermally conductive resin composition+inorganic filler+solvent (when required)) is not particularly limited as long as it provides the thermal conductivity with the thermally conductive resin sheet member to be produced. The filler is preferably at least one selected from $Al_2O_3$, MgO, BN and AlN, and also any combination thereof may be used. These fillers are particularly excellent in their thermal conduction, which makes it possible to produce a substrate having a large thermal radiation property. In particular, when $Al_2O_3$ is used, mixing with the thermally conductive resin composition becomes easy. Further, when AlN is used, the thermal radiation property of the finally produced thermally conductive substrate is particularly large, which is preferable. A form of the filler is not particularly limited, and a filler in the form of powder, granules, and/or fibers may be used. When the inorganic filler is in the form of a powder or granules, a diameter of each filler particle is preferably in the range between 0.1 µm and 100 µm. When the diameter is excessively larger or too smaller, compatibility of the inorganic filler may be insufficient.

In the thermally conductive resin sheet member attached to a lead frame according to the present invention, the thermosetting resin contained in the thermally conductive resin sheet member is in the semi-cured (or semi-hardened) state or in a partly cured state. Such a state is also referred to as a so-called B-stage. In the lead frame according to the present invention, such semi-cured state is preferably such that a gel time of the thermally conductive resin sheet member at a temperature of 155° C. is in the range between 20 seconds and 120 seconds. The gel time is more preferably in the range between 40 seconds and 100 seconds, and particularly in the range between 50 seconds and 90 seconds. When the gel time is too short, an insufficient adhesion state with a heat dissipation metal plate may be obtained in a later step of thermally pressing for the integration with the heat dissipation metal plate. When the gel time is too long, "Takt" (German language, a production cycle period) for the production of the thermally conductive substrate integrated with the heat dissipation metal plate becomes long and the thermosetting resin mixture may exude over the peripheries of the exposed surfaces of the thermally conductive substrate and the lead frame and cure so that the resin burrs, and so that stains and the like are formed.

The gel time in the present specification means a time period between a time at which the thermally conductive resin sheet member which contains the thermosetting resin in the semi-cured state reaches a predetermined temperature (usually by means of being heated) and a time at which it solidifies after rapidly loosing its fluidity, and it is measured as a time period at a specific temperature (herein 155° C. is used).

Concretely, the gel time used in the present specification means a value which is measured by the following method: A tablet shaped sample having a diameter of 25 mm (usually 8 grams) is cut out of the thermally conductive resin sheet member in the semi-cured state (such a sample may be obtained from the thermally conductive resin sheet member which has been integrated with the lead frame because no cure proceeds upon the integration with the lead frame). Then, using a Curelastometer (manufactured by JSR, Model Vps), the sample is sandwiched by an upper plate and a lower plate both of which are heated to a temperature of 155° C., sinusoidal oscillation is applied to the sample, which generates a torque, and the torque is measured. The torque increases as the cure of the thermosetting resin contained in the thermally conductive sheet member proceeds. A time period (from just after sandwiching) to the time at which the torque exceeds 0.1 kgf/cm$^2$ is measured as the gel time at a temperature of 155° C. A basic principle of such method to measure the gel time is generally known.

Further, in the thermally conductive resin sheet member attaching lead frame according to the present invention, the thermally conductive resin sheet member preferably has a viscosity in the range between $10^2$ Pa.s and $10^5$ Pa.s, and more preferably between $10^3$ Pa.s and $10^5$ Pa.s. A viscosity below $10^2$ Pa.s leads to excessive deformation upon the production of the thermally conductive substrate so that the deformation of the resin burrs and the surface stains may not be sufficiently suppressed on the exposed surface of the lead frame. On the other hand, a viscosity above $10^5$ Pa.s does not provide a sufficient flexibility of the thermally conductive resin sheet member, so that the production of the thermally conductive substrate may be difficult.

It is noted that the viscosity of the thermally conductive resin sheet member is measured according to the following method. A "cone and plate" type elasto-viscosity measurement apparatus (manufactured by Rhelogy Co., Ltd., dynamic elasto-viscosity measurement apparatus MR-500) is used for the measurement. The sheet member is processed into a predetermined size and located between a plate and a cone having a diameter of 17.97 mm and a cone angle of 1.15 degrees. Sinusoidal oscillation is applied to the sample in a twisting direction, and a difference in the phases of torque which is generated by the sinusoidal oscillation is calculated, whereby the viscosity is calculated. As to the thermally conductive resin sheet member according to the present invention, the viscosity was obtained at a temperature of 25° C. under conditions that the sinusoidal oscillation was a sine wave with a frequency of 1 Hz, a strain was 0.1 deg., and a load was 500 g.

In the thermally conductive resin sheet member attached to the lead frame according to the present invention, since the thermally conductive resin sheet member is integrated with the lead frame while the thermosetting resin is in the semi-cured state, the production cycle period becomes shorter upon the production of the thermally conductive substrate compared with the production wherein an uncured thermosetting resin is used, and the lead frame and the heat dissipation metal plate are integrated with the resin. In addition, since the integration of the lead frame with the thermally conductive resin sheet member which contains the thermosetting resin in the semi-cured stage is carried out under a condition which does not provide substantial progress of the curing of the thermosetting resin as explained below, the resin burrs and stains are not formed on the exposed surface of the integrated lead frame.

In one embodiment of the thermally conductive resin sheet member attached to the lead frame according to the present invention, a portion of the lead frame is integrated with the thermally conductive resin sheet member. For example, the thermally conductive resin sheet member is not present under an outer periphery portion of the lead frame, and thus the lead frame except such outer periphery portion is integrated with the thermally conductive resin sheet member. In such embodiment, the lead frame is desirably such that through common terminal(s) (preferably common terminal(s) extending from the thermally conductive resin sheet member toward the outside thereof) which are connected to an outer frame portion of the lead frame, and the other terminals of the lead frame are electrically connected to the outer frame portion. This prevents any terminal of the lead frame from falling down from the thermally conductive resin sheet member attached to the lead frame so that handling of the thermally conductive resin sheet member attached to the lead frame is improved.

In one preferable embodiment of the thermally conductive resin sheet member attached to the lead frame according to the present invention, a portion of the lead frame is integrated with the thermally conductive resin sheet member, and at least one circuit pattern or a terminal which is electrically independent of the integrated lead frame is present (on the same side as the lead frame) while integrated with the thermally conductive resin sheet member. This keeps the independent circuit pattern or terminal in an isolated island-like form on the thermally conductive resin sheet member while being electrically independent of the lead frame, so that such isolated circuit pattern or terminal does not fall down from the thermally conductive resin sheet member attached to the lead frame, which improves handling of the thermally conductive resin sheet member attached to the lead frame.

As described below in detail, the thermally conductive resin sheet member attached to the lead frame as described above is produced by stacking the lead frame and the thermally conductive resin sheet member of which thermosetting resin contained therein is in the semi-cured state, and pressurizing (or pressing) and (when required) heating them at a temperature at which the thermosetting resin of the thermosetting resin sheet member does not cure (therefore, curing does not proceed) so that they are integrated. Such lead frame preferably forms a surface such that the lead frame flushes with the thermally conductive resin sheet member attached to the lead frame. That is, the lead frame has circuit patterns, and it has at least one through-opening, and the through-opening is preferably filled with the thermally conductive resin sheet member up to the exposed surface of the lead frame.

It is noted that the lead frame to be used is not particularly limited and it may be one which is usually used for electronic circuit boards. A material for the lead frame may be any one which has a large electric conductivity and also which is readily worked. For example, it may be copper, iron, nickel, aluminum, silver, or various alloys which contain those materials as main components. A wiring pattern is formed in the lead frame, and a known chemically etching method, a known stamping out method using a die, or a known stamping out method using punching may be used for the formation of the wiring pattern. The lead frame may be plated so as to prevent its surface oxidation and also to improve its surface solder wetting property. As to species of the plating, tin, nickel, lead, silver, gold, palladium, chromium and alloys including those elements as main components may be used. Further, it is preferable to roughen a surface to be bonded of the lead frame so as to improve its adhesion with the thermally conductive resin sheet member. There is no particular limitation as to a method for roughening the surface, and sand blasting, abrasion and chemical etching may be used.

As described above, when the step of integrating the lead frame with the thermally conductive resin sheet member of which thermosetting resin is in the semi-cured state is carried out under the condition (especially the temperature) which provides substantially no progress of curing of the thermosetting resin contained in the thermally conductive resin sheet member, exudation of the thermosetting resin mixture onto the exposed surface of the lead frame is suppressed. The produced thermally conductive resin sheet member attaching lead frame may be then cooled as required (for example cooled to the room temperature), and it can be stored as it is.

Further, when a heat dissipation metal plate is stacked on the thermally conductive resin sheet member which has been thus integrated with the lead frame, followed by heating them so that curing proceeds and then by heating with pressing so that the thermally conductive substrate is produced, overflows of the thermosetting resin mixture onto the exposed surfaces of the lead frame and the heat dissipation metal plate are suppressed. Therefore, the formation of the stains and the resin burrs on the exposed surfaces is prevented.

Thus, in the second aspect, the present invention provides a process for the production of a thermally conductive resin sheet member attached to a lead frame which comprises a lead frame which is located on and which is integrated with a thermally conductive sheet member formed from a thermally conductive resin mixture comprising an in organic filler and a thermosetting resin composition in a semi-cured state.

The process comprises:

(*a*) obtaining the thermally conductive resin sheet member from the thermally conductive resin mixture comprising the inorganic filler and the thermally conductive resin composition which comprises the thermosetting resin;

(b) thermally treating the thermally conductive resin sheet member so that it has a predetermined gel time; and (c) placing the lead frame on the thermally conductive resin sheet member and pressing them toward each other under a temperature at which curing of the thermally conductive resin does not proceed so as to integrate the lead frame and the sheet member.

It is noted that the above explanations as to the thermally conductive resin sheet member attached to the lead frame according to the present invention (for example, the details as to the thermosetting resin, the inorganic filler, the gel time, the lead frame and so on) and explanations shown below are also applicable to various processes according to the present invention which will be explained below as far as there occurs no particular inconvenience.

In the process of the production of the lead frame according to the present invention, step (a) may be carried out by blending the thermosetting resin, the inorganic filler and the other one or more components when necessary, and further mixing them with a solvent (for example, methyl ethyl ketone (MEK), toluene, iso-propanol or the like) so as to obtain the thermosetting resin mixture of which viscosity is adjusted. The thus-obtained thermosetting resin mixture is then applied onto a substrate followed by drying for the removal of the solvent so that a sheet like member is obtained. As far as the sheet like member is obtained, the thermosetting resin mixture may be processed by another method such as extrusion. Such a step is preferably carried out under the condition which provides substantially no cure progress of the thermosetting resin. In this case, the thermally conductive resin sheet member has a long gel time, and it can be stored for a long time. However, in another embodiment, the cure of the thermosetting resin may proceed in step (a) as far as the gel time can be adjusted in step (b). For example, even though step (a) is carried out at a temperature at which the cure proceeds, the gel time adjustment in step (b) can be achieved if a time for step (a) is short. The cure of the thermosetting resin is controlled usually by temperature control, and therefore whether or not the cure proceeds in step (a) is determined by a thermal condition (that is, a temperature condition to which the thermally conductive resin composition and the inorganic filler are subjected to during the production of the sheet member). The temperature condition under which the cure proceeds depends on the thermosetting resin to be used, and step (a) is carried out at a temperature usually not higher than 90° C., preferably not higher than 85° C., and more preferably not higher than 80° C.

It is noted that the preparation method of the thermosetting resin mixture is not particularly limited as far as it can achieve sufficient mixing of components to be mixed. For example, mixing with a ball mill, mixing with a stirrer, and mixing with a planetary mixer may be exemplified. Also, the application method of the thermosetting resin mixture (i.e. the film (or sheet) formation method from the thermosetting resin mixture) is not particularly limited, and a doctor blade method, a coater method, an extrusion method or the like may be used. In particular, when the thermosetting resin mixture is prepared using the solvent and applied, the doctor blade method is preferably used since it is advantageous in that the film formation is easy.

Such application (or film formation) may be carried out onto a release film, in which case handling of the thermally conductive resin sheet member is improved when it is stored. As the release film, there is no particular limitation, and a PET (polyethylene terephthalate) film, a PPS (polyphenylene sulfide) film and the like may be used. Also, a surface of the film is preferably treated using a release agent such as silicone.

It is noted that as to the details of step (a), Japanese Patent Kokai Publication No. 10-173097 is referred to above, and its counterpart U.S. Pat. No. 6,060,150 may be referred to, and the contents of these patent documents are incorporated herein by the references thereto.

In the production process of the lead frame according to the present invention, the thermally conductive resin sheet member which is obtained in step (a) is thermally treated. The thermally conductive resin sheet member which is to be thermally treated may either be one which was cooled after step (a) and has been stored as required, or one which has just completed step (a) (therefore, it may still be warm). The thermal treatment in step (b) is a treatment in which the thermally conductive resin sheet member is subjected to a predetermined time temperature condition for a predetermined time period. For example, it may be placed in an atmosphere having the predetermined temperature so that the gel time of the sheet member is adjusted within a range as predetermined. Generally, when the predetermined temperature is higher, the predetermined time is shorter. In step (b), the cure of the thermosetting resin partly proceeds to reach the predetermined gel time. The thermal treatment is carried out usually at a temperature in a range between 80° C. and 140° C., preferably in the range between 85° C. and 130° C., and more preferably in the range between 90° C. and 125° C. The predetermined temperature and the predetermined time period which provide the predetermined gel time can be properly selected by those skilled in the art by measuring the gel times obtained by the thermal treatments under various temperatures and various time periods depending on the thermosetting resin to be used. That is, they can be selected by a trial-and-error method. The predetermined gel time is preferably in the range between 20 seconds and 120 seconds at a temperature of 155° C. as described above. After heating for the predetermined time period in step (b), the thermally conductive resin sheet member is cooled to a temperature at which substantially no cure proceeds (for example to a temperature of not higher than 80° C., preferably not higher than 50° C., and for example to the room temperature), and then the step (c) is carried out after storing it if necessary.

In the production process of the lead frame according to the present invention, the thermally conductive resin sheet member having the predetermined gel time is integrated with the lead frame by pressurizing the thermally conductive resin sheet member and the lead frame (namely pressing them to each other) under a condition which does not provide any substantial cure progress of the thermosetting resin of the thermally conductive resin sheet member. Upon such pressurizing, when the thermally conductive resin sheet member is at a temperature which is not so high (for example at the room temperature) so as to have a sufficient adhesion property, it may be heated to obtain such adhesion property or the lead frame can be placed on the thermally conductive resin sheet member followed by heating them so as to give such adhesion property. Thus, the lead frame is integrated with the thermally conductive resin sheet member. On the other hand, when the thermally conductive resin sheet member already has an adhesion property (or tackiness property) which is sufficient for the integration (for example when the thermally conductive resin sheet member is at a relatively high temperature because it is in a condition of being just after step (b)), no heating is required. It is noted that attention should be paid so as to avoid the cure progress of the thermosetting resin in the step (c). Whether or not the cure proceeds can be easily determined by measuring the gel time of the thermally conductive resin sheet member after step (c) and comparing it with the gel time adjusted in step (b). If it is determined that the cure proceeded, the temperature at which step (c) is carried out is lowered. In the production process of the lead frame according to the present invention, pressing in step (c) is carried out at temperature in the range between 30° C. and 90° C., preferably in the range between 40° C. and 80° C., more preferably in the range between 50° C. and 70° C., and for example at a temperature of 65° C., and under a pressure in the range between 1 MPa and 20 MPa, preferably in the range between 3 MPa and 15 MPa, more preferably in the range between 6 MPa and 12 MPa, and for example a pressure of 10 MPa for a period in the range between 10 seconds to 200 seconds, preferably in the range between 30 seconds to 100 seconds, more preferably in the range between 40 seconds to 80 seconds and for example 60 seconds.

The lead frame has at least one through-opening as described above, and step (c) is preferably carried out so that the thermally conductive resin sheet member fills the through-opening up to the exposed surface of the lead frame. Thus, the exposed surface of the lead frame is substantially flush with a portion of the thermally conductive resin sheet member which fills the through-opening (namely, they form a single surface).

In one preferable embodiment, the production process of the thermally conductive resin sheet member attached to the lead frame according to the present invention as described above desirably comprises the step of forming the thermally conductive resin sheet member into a predetermined shape between steps (b) and (c). The predetermined shape may be selected by those skilled in the art depending on the application of the finally obtainable thermally conductive substrate. Concretely, the thermally conductive resin sheet member is cut into the predetermined shape. Alternatively, the predetermined shape may be obtained by stamping it out of the thermally conductive resin sheet member. Forming the predetermined shape controls a weight of the thermally conductive resin sheet member to be produced.

In the step of forming the thermally conductive resin sheet member into the predetermined shape in the above preferable embodiment, the thermally conductive resin sheet member is sandwiched by a pair of plates, and the plates are allowed to approach each other so as to press the thermally conductive resin sheet member such that a predetermined spacing between the plates is achieved. The thermally conductive resin sheet member has a thickness corresponding to the spacing between the plates and the obtained sheet member is formed into the predetermined shape. When the thermally conductive resin sheet member is processed as described above, it has a uniform thickness so that an amount (volume or weight) per unit area of the thermally conductive resin sheet member becomes constant. As a result, forming (for example, cutting) such thermally conductive resin sheet member into the predetermined shape controls the amount of the thermosetting resin mixture (namely, a mixture of the thermally conductive resin composition and the inorganic filler) which constitutes one piece of the formed thermally conductive resin sheet member. Thus, the volume of the thermally conductive resin sheet member which is to be integrated with the lead frame in the next step can be made constant.

In another preferable embodiment, the production process of the thermally conductive resin sheet member attached to the lead frame according to the present invention as described above removes a portion of the lead frame which has been integrated with the thermally conductive resin sheet member after step (c). The portion of the lead frame to be removed is preferably one that has been integrated with the thermally conductive resin sheet member, and the removal of such portion can form a portion of the lead frame which has been integrated with the lead frame into a circuit pattern or a terminal which is electrically independent of the remaining portions of the lead frame. In this case, the electrically independent circuit pattern or terminal is supported by the thermally conductive resin sheet member, so that it is possible to produce a thermally conductive resin sheet member attached to the lead frame which includes the rest portions as a lead frame without dropout of such electrically independent circuit pattern or terminal.

In one embodiment, the production process of the thermally conductive resin sheet member attached to the lead frame of the second aspect according to the present invention comprises step (c) in which the thermally conductive resin sheet member and the lead frame are sandwiched between two plates, and the plates are allowed to approach each other so that a spacing between them becomes a predetermined spacing. Thus, the thermally conductive resin sheet member and the lead frame are pressed to each other so that the thermally conductive resin sheet member which is integrated with the lead frame and which has a predetermined thickness is obtained. The process further comprises step (d) in which the thermally conductive resin sheet member which has been integrated with the lead frame is formed into a predetermined shape. This embodiment is effective in that the adjustment of the thickness of the thermally conductive resin sheet member as well as the integration of the thermally conductive resin sheet member with the lead frame can be carried out simultaneously.

The lead frame which is produced by the production process of the thermally conductive resin sheet member attached to the lead frame as described above can be used for the production of the thermally conductive substrate in combination with the heat dissipation metal plate. Thus, in the third aspect of the present invention, there is provided a process of producing a thermally conductive substrate comprising a thermally conductive resin sheet member, a lead frame and a heat dissipation metal plate which comprises the steps of:

(1) placing the heat dissipation metal plate on the thermally conductive resin sheet member attached to the lead frame which is produced according to the second aspect of the present invention so that the lead frame and the metal heat dissipation metal plate are opposed through the thermally conductive resin sheet member;

(2) thermally treating the thermally conductive resin sheet member attached to the lead frame and the heat dissipation metal plate without pressing them to each other for a predetermined period at a temperature not lower than a temperature at which cure of the thermosetting resin proceeds; and (3) thereafter, pressing the lead frame and the heat dissipation metal plate to each other while continuing the thermal treatment so that the cure of the thermosetting resin further proceeds while the heat dissipation metal plate is integrated with the thermally conductive resin sheet member attached to the lead frame.

After the production of the thermally conductive resin sheet member attached to the lead frame in the above production process of the thermally conductive substrate, when a plurality of the thermally conductive resin sheet members (preferably many thermally conductive resin sheet members) are produced in step (a), and their gel times are adjusted together in step (b) through the thermal treatment, the cure of the thermosetting resin contained in all of the thermally conductive resin sheet members attached to a lead frame has proceeded so that a time period required for the production of the thermally conductive substrate, and thus a time period required for steps (1) to (3), can be shortened. In addition, the integration of the lead frame with the thermally conductive resin sheet member has already been carried out while suppressing the formation of the resin burrs and the stains as described above, so that the presence of the resin burrs and the stains on the lead frame which is to be used for the production of the thermally conductive substrate has been suppressed. Since the heat dissipation metal plate is integrated with such lead frame which has been integrated with the thermally conductive resin sheet member, the resin burrs and the stains present on the exposed surface of the lead frame of the finally obtainable thermally conductive substrate can be suppressed. In particular, when the lead frame which has been integrated with the thermally conductive resin sheet member is stacked on the heat dissipation metal plate followed by only heating them so as to allow the cure of the thermosetting resin to proceed and then by pressing them to each other (that is, when step (2) is carried out and then step (3) is carried out), the presence of the resin burrs and the stains on the exposed surfaces of the lead frame and the heat dissipation metal plate is further suppressed.

In step (1) of the production process of the thermally conductive substrate according to the present invention, the heat dissipation metal plate is placed on the thermally conductive resin sheet member of the thermally conductive resin sheet member attached to the lead frame which is produced by the production process of the thermally conductive resin sheet member attached to the lead frame as described above, so that the lead frame and the heat dissipation metal plate are opposed to each other. The heat dissipation metal plate to be used is a flat plate which has a high thermal conductivity. For example, an aluminum plate, a copper plate or the like may be used. In addition, similarly to the lead frame, a bonding surface of the heat dissipation metal plate which is to bond to the thermally conductive resin sheet member is preferably roughened, which may be carried out in the same manner as in the case of the lead frame. Further, a heat dissipation plate which is not made of a metal may be used as far as it has a similar performance to that of the heat dissipation metal plate. Also, a heat dissipation metal plate having a main surface opposed to the bonding surface which is not flat (for example, such a main surface is corrugated or has fins) may be used. Such a plate having the non-flat surface may be a member which is used as a so-called heat sink.

In step (2) of the production process of the thermally conductive substrate according to the present invention, the thermal treatment is carried out for the predetermined time period at the temperature which allows the cure of the thermosetting resin to proceed while the heat dissipation metal plate is stacked on the thermally conductive resin sheet member or the thermally conductive resin sheet member is stacked on the heat dissipation metal plate. It is noted that "thermal treatment" herein means that an object is kept at a predetermined temperature for a predetermined time period while heating the object if necessary so as to keep such temperature (in this sense, "thermal treatment" is also referred to as a heating treatment). Usually, the object is placed in an atmosphere at a predetermined temperature for a predetermined time period, and such time period and such temperature correspond to the predetermined time period and the predetermined temperature of the thermal treatment, respectively. Upon completion of the thermal treatment in this step, pressing the heat dissipation metal plate and the lead frame to each other is not positively carried out. This does not mean that any unavoidable pressure is excluded. For example, pressures which are generated because of the weight of the heat dissipation metal plate, the lead frame, the thermally conductive resin sheet member and so on are not excluded. The temperature which allows the cure may be a temperature which is the same as or higher than the temperature at which the gel time is adjusted. Usually, the temperature may be equal to or higher than a temperature which a manufacturer of the thermosetting resin recommends so as to cure the thermosetting resin. Generally, it is particularly preferable that the temperature is higher than a curing temperature of the thermosetting resin, and the curing temperature is understood to be a peak temperature obtained by the thermal analysis of the thermosetting resin. The step (2) is usually carried out at a temperature in the range usually between 100° C. and 230° C. and preferably between 140° C. and 180° C. The predetermined time period of the thermal treatment is usually within one minute, preferably within 30 seconds, and for example about 15 seconds.

As clearly seen, the predetermined time period of the thermal treatment and the temperature which allows the cure (thus, the temperature of the thermal treatment) are selected appropriately depending on the thermosetting resin to be used. The selection should be carried out so as to avoid an excessive extent of the cure progress which leads to rapid decrease of a bonging property of the thermally conductive resin sheet member, which results in insufficient integration of the thermally conductive substrate which is obtained after step (3). The selection should also be carried out so as to avoid a less extent of the cure progress, which leads to a relatively low viscosity of the thermally conductive resin sheet member, which results in the formation of the resin burrs, the stains and the like on the exposed surfaces of the lead frame and the heat dissipation metal plate of the thermally conductive substrate which is obtained after step (3). Such temperature and such time period of the thermal treatment can be selected by the trial-and-error method as in the case of the selection of the predetermined temperature and the predetermined time which give the predetermined gel time described above.

In step (3) of the production process of the thermally conductive substrate according to the present invention, the thermal treatment is continued after step (2), and the heat dissipation metal plate and the lead frame are pressed to each other at a temperature which allows the cure to continue (which temperature may be higher or lower as required than the temperature of step (2)), namely positive pressing is carried out. In this step, the cure of the thermosetting resin further proceeds so that the thermosetting resin achieves a so-called rigid state. Such a state is not necessarily a completely cured state as far as such state allows the use of the thermally conductive substrate. In step (3), pressing is carried out at a temperature in the range usually between 100° C. and 230° C., preferably between 120° C. and 200° C., more preferably between 130° C. and 180° C. and for example 140° C. under a pressure in the range between 1 MPa and 20 MPa, preferably between 4 MPa and 19 MPa, more preferably between 6 MPa and 18 MPa, and for example 14 MPa for a time period in the range between 1 minute and 120 minutes, preferably within 5 minutes and 60 minutes, more preferably within 8 minutes and 30 minutes and for example 10 minutes.

Therefore, in the production process of the thermally conductive substrate according to the present invention, when the cure has not been finished completely after step (3), the produced thermally conductive substrate is preferably subjected to an additional thermal treatment if necessary (namely, subjected to heating) so that the thermosetting resin is sufficiently cured. Such additional treatment should of course be carried out at a temperature which allows the further cure, and the time period and the temperature of the treatment can be selected appropriately depending on an extent of the cure. Such additional thermal treatment is carried out at a temperature in the range usually between 100° C. and 230° C., preferably between 120° C. and 200° C., more preferably between 150° C. and 180° C. and for example 175° C. for a time period in the range between 1 hour and 10 hours, preferably within 2 hours and 9 hours, more preferably within 3 hours and 7 hours and for example 6 hours. If necessary, pressing may be carried out upon the treatment under a pressure in the range between 1 MPa and 20 MPa, preferably between 3 MPa and 19 MPa, more preferably between 4 MPa and 18 MPa, and for example 6 MPa.

In the fourth aspect of the present invention, there is provided another process of producing a thermally conductive substrate comprising a thermally conductive resin sheet member, a lead frame and a heat dissipation metal plate. The process comprises:

(A) forming a thermally conductive resin sheet member from a material comprising an inorganic filler and a thermally conductive resin composition which comprises at least a thermosetting resin;

(B) thermally treating the thermally conductive resin sheet member so that it has a predetermined gel time;

(C) placing the heat dissipation metal plate on the thermally conductive resin sheet member and pressing them to each other at a temperature which does not allow cure of the thermosetting resin to proceed, so that they are integrated together;

(D) placing a lead frame on the thermally conductive resin sheet member which has been integrated with the heat dissipation metal plate so that the lead frame and the heat dissipation metal plate are opposed through the thermally conductive resin sheet member; and (E) thermally treating the lead frame and the thermally conductive resin sheet member which has been integrated with the heat dissipation metal plate at a temperature which is not lower than a temperature which allows the cure of the thermosetting resin to proceed while pressing the lead frame and the metal heat dissipation plate to each other under at a predetermined pressure and allowing the cure of the thermosetting resin to proceed.

In the above production process of the thermally conductive substrate, the above explanations as to the step to produce the thermally conductive resin sheet member (the above step (a)) and the step to adjust the gel time (the above step (b)) are applicable to steps (A) and (B). Also, similarly to the above, the detailed explanations as to the first to the third aspects of the present invention are applicable to the fourth aspect as far as nothing adverse occurs.

In step (C) of the above production process of the thermally conductive substrate, the heat dissipation metal plate is stacked on the thermally conductive resin sheet member followed by thermally treating them at a temperature which does not allow the cure of the thermosetting resin to proceed while pressing them so that they are integrated together. In this step, the above explanations as to the step to stack the lead frame on the thermally conductive resin sheet member and integrate them together (the above step (c)) are applicable. It is noted that the "temperature which does not allow the cure of the thermosetting resin to proceed" is the same temperature as in the integration of the lead frame together with the thermally conductive resin sheet member.

In step (D) of the above production process of the thermally conductive substrate, the lead frame and the metal heat dissipation metal plate are placed so that they oppose to each other as in step (1) as described above. Further, step (E) is similar to step (3) as described above (and thus the explanations as to step (3) are applicable to step (E)), and the lead frame and the heat dissipation metal plate are pressed to each other while thermally treating them so as to cure the thermosetting resin. It is noted that in this other production process of the thermally conductive substrate, a step of heating without pressing (which corresponds to the step (2) as described above) is not essential, but such heating step may be carried out. Similarly to the above, when the cure of the thermosetting resin of the produced thermally conductive substrate has not been completed and additional cure is desired, an additional thermal treatment may be carried out so as to achieve a sufficient extent of the cure.

The present invention is based on the thermally conductive resin sheet member attached to the lead frame in which the thermally conductive resin sheet member is produced by forming the sheet form article from the thermosetting resin mixture including the inorganic filler and the thermosetting resin of which cure has not yet proceeded, and adjusting the gel time of the sheet form article, and in which such thermally conductive resin sheet member of which thermosetting resin is in the semi-cured or partly cured condition is integrated with the lead frame preferably while the thermally conductive resin sheet member is filled up to the surface of the lead frame.

Such thermally conductive resin sheet member attached to the lead frame according to the present invention is used for the production of the thermally conductive substrate which is superior in its thermal radiation. In such production, the thermally conductive resin sheet member is thermally pressed with the heat dissipation metal plate so as to cure the thermosetting resin while containing a large amount of the inorganic filler and also to integrate the lead frame, the thermally conductive resin sheet member and the heat dissipation metal plate together, whereby the thermally conductive substrate is readily obtained. In addition, the thermally conductive resin sheet member is accordingly reinforced by the lead frame due to the integration of the thermally conductive resin sheet member with the lead frame, which leads to handling improvement of the thermally conductive resin sheet member.

EMBODIMENTS OF THE INVENTION

The thermally conductive resin sheet member attached to the lead frame and the production process thereof, and the production process of the thermally conductive substrate using the thermally conductive resin sheet member attaching lead frame will be hereinafter explained in detail with reference to the accompanied drawings.

Embodiment 1

FIG. 1 schematically is a cross-sectional view which shows a construction of the thermally conductive resin sheet member attached to the lead frame of the present invention. In FIG. 1, the thermally conductive resin sheet member 101 is integrated with the lead frame 102, and fills the through-openings 103 so as to reach the exposed surface of the lead frame (the upper surface in the shown embodiment). Thus, the thermally conductive resin sheet member 101 together with the lead frame 102 forms a single surface (namely, an upper side flush surface). It is noted that the thermally conductive resin sheet member 101 is made of a mixture which includes, for example, 70 to 95 parts by weight of an inorganic filler and 5 to 30 parts by weight of a resin composition containing at least the thermosetting resin, and the thermally conductive resin sheet member is in the semi-cured state.

Embodiment 2

Figure 2:
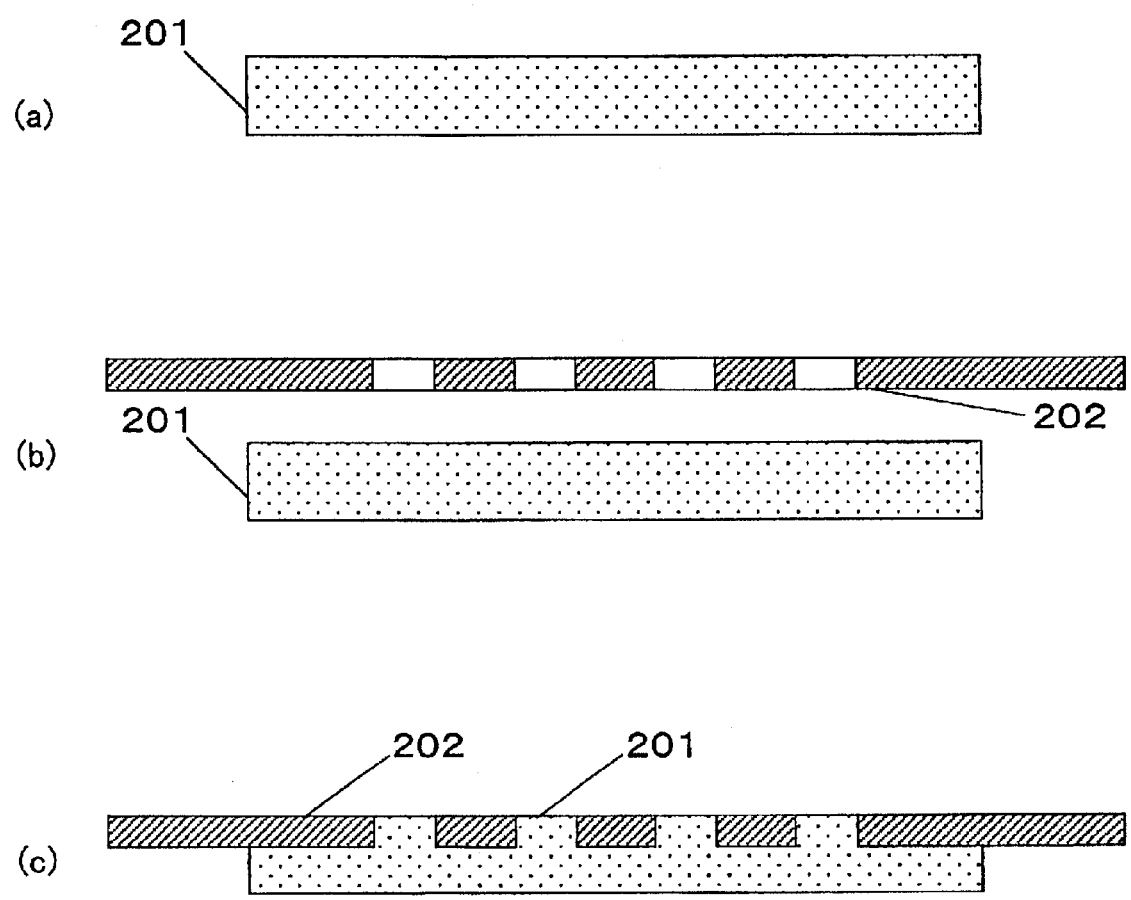
FIGS. 2(a) to 2(c) schematically show cross-sectional views of steps of one embodiment of a production process of a lead frame attached to a thermally conductive resin sheet member according to the present invention.

FIGS. 2(*a*) to 2(*c*) schematically show the steps of the production process of the thermally conductive resin sheet member attached to the lead frame according to the present invention. The materials to be used are similar to those which are described in the above descriptions (including those of Embodiment 1) unless specifically explained.

FIG. 2(*a*) shows the thermally conductive resin sheet member 201 which is produced from the thermosetting resin mixture, and of which gel time has been adjusted to a predetermined time as will be described below.

The thermally conductive resin sheet member 201 is produced by applying the thermosetting resin mixture onto a substrate (which may be a release film) to produce a film or sheet member, followed by drying to remove the solvent so that almost no solvent is left in the film member. When the thermally conductive resin sheet member 201 is thus formed, it is preferably that the cure of the thermosetting resin contained therein does not proceed, so that the thermally conductive resin sheet member 201 has a long gel time at this stage and therefore it can be stored stably for a long time period.

Then the thermally conductive resin sheet member 201 thus obtained is thermally treated so that it is adjusted to have the predetermined gel time, followed by cooling it to a temperature which does not substantially allow the cure. The thermal treatment can be carried out by keeping the thermally conductive resin sheet member 201 at a predetermined temperature for a predetermined time period (heating may be carried out for such treatment when necessary), and for example a drying oven may be used for the treatment. In the thermal treatment, a plurality of the thermally conductive resin sheet members, preferably many members, can be effectively treated together beforehand. The members are integrated with the lead frame later on, and the formation of the resin burrs and the stains can be suppressed upon the integration of the thermally conductive sheet member with the lead frame. In addition, the thermal treatment also removes the rest of the solvent which was used for the viscosity adjustment upon the production of the thermally conductive resin sheet member (or the film member formation) as well as a moisture content which was absorbed during storing and handling of the sheet member. The treatment further improves handling of the thermally conductive resin sheet member because the tackiness of the thermally conductive resin sheet member is reduced. The thermal treatment is desirably carried out at a temperature which is lower than the curing temperature of the thermosetting resin contained in the thermally conductive resin sheet member, and it may be carried out under a vacuum condition or a reduced pressure condition in order to reduce voids in the thermally conductive resin sheet member.

In FIG. 2(*b*), the lead frame 202 is placed on the thermally conductive resin sheet member 201 which has the predetermined gel time. They are pressed at a temperature which does not allows curing of the thermosetting resin contained in the thermally conductive resin sheet member (for this purpose, heating may be carried out if necessary), and the thermally conductive resin sheet member attached to the lead frame according to the present invention is obtained while the thermally conductive resin sheet member 201 fills the lead frame 202 up to its surface and they are integrated together as shown in FIG. 2(*c*). It is noted that heating may be carried out while the lead frame 202 is not in contact with the thermally conductive resin sheet member 201, or while the lead frame 202 is in contact with the thermally conductive resin sheet member 201. Further, pressing may be carried out simultaneously with or after heating, or heating may be carried out after pressing.

In this embodiment, the thermally conductive resin sheet member is desirably formed to have the predetermined shape after the thermal treatment of the thermally conductive resin sheet member for adjusting the gel time. It is noted that "formed to have the predetermined shape" means that a dimension(s) of the formed thermally conductive resin sheet member is close to the predetermined one(s), and preferably substantially the same as predetermined. It is possible by such formation to control the weight of the thermally conductive resin sheet member (that is, to obtain the thermally conductive resin sheet member which has a predetermined weight or volume).

Figure 3:
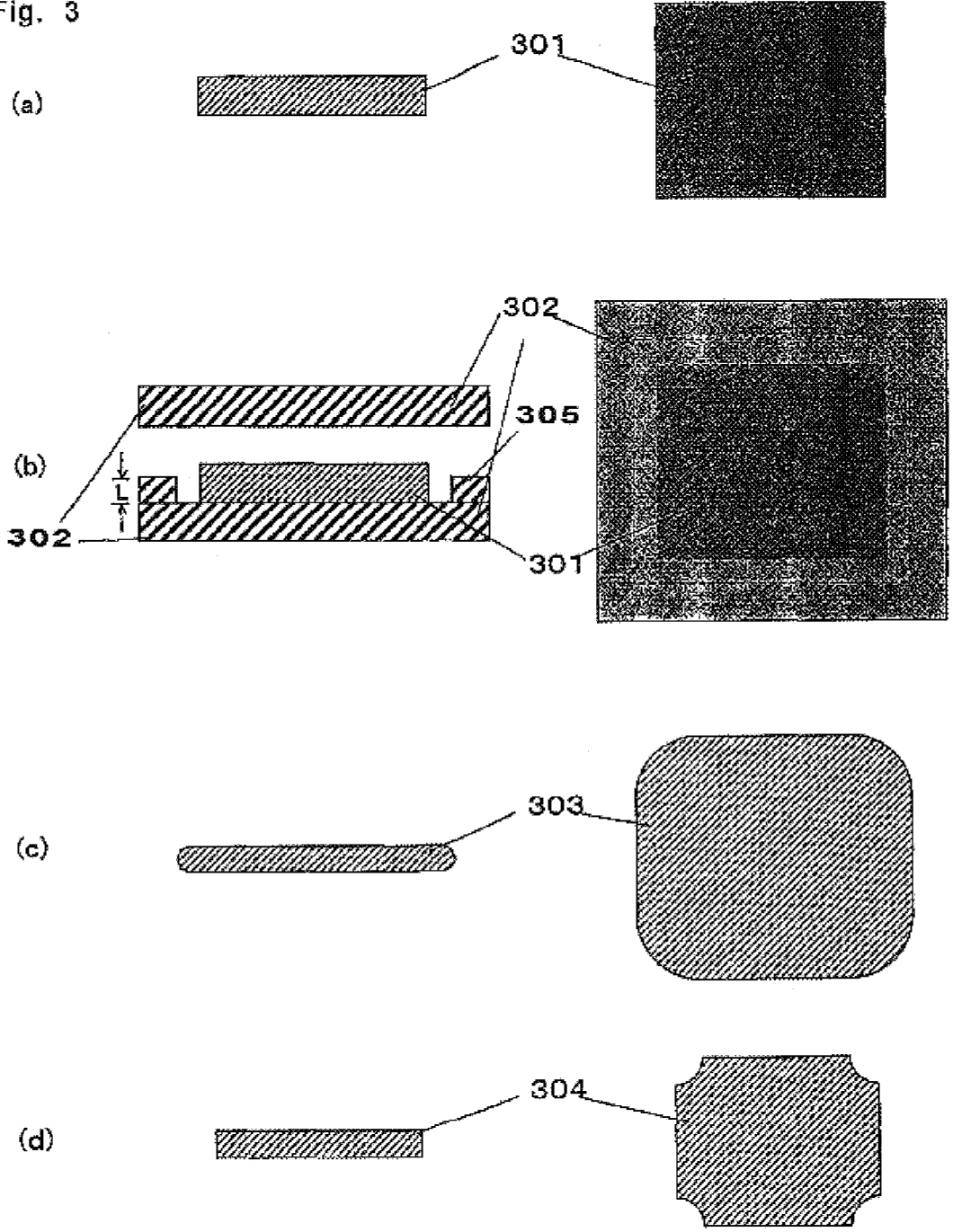
FIGS. 3(a) to 3(d) schematically show cross-sectional views and top views of steps of one embodiment of a production process of a thermally conductive resin sheet member.
Figure 4:
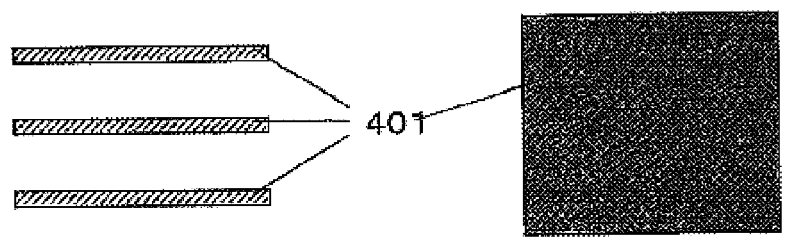
FIGS. 4(a) to 4(d) schematically show cross-sectional views and top views of steps of another embodiment of a production process of a thermally conductive resin sheet member.
Figure 4:
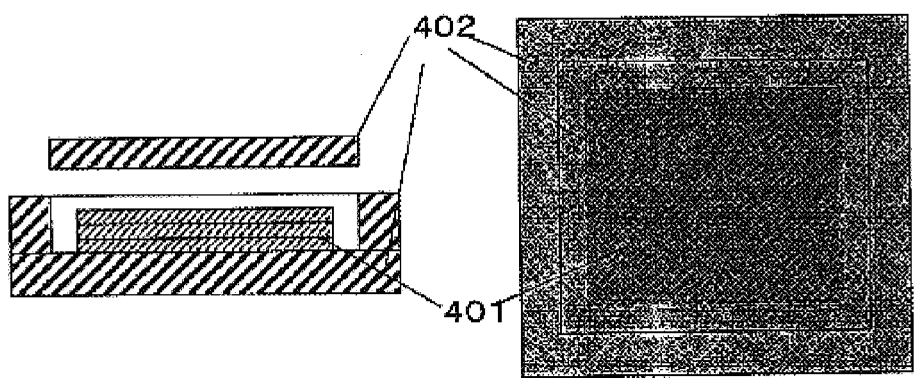
Figure 4:
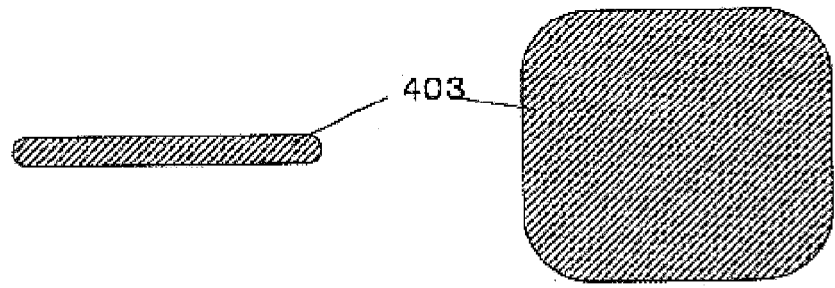
Figure 4:
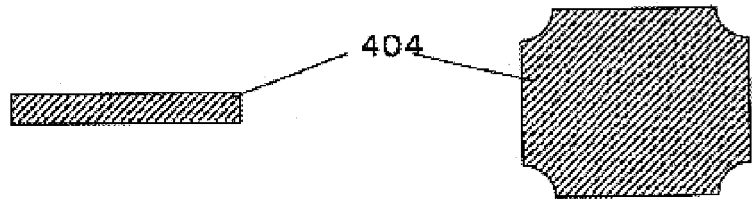

FIGS. 3(*a*) to 3(*d*) and FIGS. 4(*a*) to 4(*d*) schematically show the steps to form the thermally conductive resin sheet member into the predetermined shape. It is noted that in those drawings, cross-sectional views are shown on the left hand side in the drawings and top views are shown on the right hand side in the drawings.

FIG. 3(*a*) shows a thermally conductive resin sheet member 301 for which gel time has been adjusted by the thermal treatment as described with reference to FIG. 2. As shown in FIG. 3(*b*), the thermally conductive resin sheet member 301 is sandwiched between a pair of plates 302 between which a spacer 305 having a thickness of L is located, and the plates are arranged such that a spacing between them can be narrowed to a predetermined spacing (L). Thereafter, the plates are moved toward each other up to the predetermined spacing so that the thermally conductive resin sheet member 301 is pressed. FIG. 3(*c*) shows the thermally conductive resin sheet member 303 which is removed from the spacing between the plates after pressing. Such thermally conductive resin sheet member 303 has a fixed thickness which corresponds to the thickness (L) of the spacer. Thereafter, the thermally conductive resin sheet member 303 is processed (for example, cut) according to the predetermined shape thereof so as to provide the thermally conductive resin sheet member 304 as shown in FIG. 3(*d*) having the predetermined shape. Since the thermally conductive resin sheet member 304 has a constant thickness, an amount (size) per unit area of the thermally conductive resin sheet member 304 becomes constant (namely, the size is controlled). Further, the thermally conductive resin sheet member 304 has a predetermined shape, an amount of the thermally conductive resin sheet member 304 as a whole also becomes constant, and such amount is also controlled.

The pair of plates 302 used in this case are not particularly limited as far as material and shape, and are selected so that the plates are not substantially deformed in the above operations. For example, a pair of flat plates between which a fixed gap is formed, or a die combined with a punch and Especially, punching using the die is preferable. This is because the predetermined shape can be formed in a short time period with good accuracy. As a material for the plates, for example, a silicon steel, a stainless steel or the like may be used.

The formation into the predetermined shape as described above is preferably carried out under a temperature condition which does not substantially allow the progress of the cure of the thermosetting resin contained in the thermally conductive resin sheet member. Such condition may be substantially the same as that for the integration of the thermally conductive resin sheet member with the lead frame.

More concretely, the temperature upon sandwiching by the pair of the plates and pressing the thermally conductive resin sheet member, for example, a temperature of the plate and/or a temperature of the thermally conductive resin sheet member, or a temperature of an atmosphere in which such pressing is carried out, is preferably a temperature at which the cure of the thermosetting resin does not substantially proceed. However, pressing may be carried out at a temperature which is higher than the temperature at which the cure of the thermosetting resin does not substantially proceed even though the cure proceeds more or less. This is because pressing at such higher temperature reduces the viscosity of the thermally conductive resin sheet member so that the control of the amount becomes easy. The temperature for the formation into the predetermined shape as described above may be selected depending on the viscosity of the thermally conductive resin sheet member to be formed at the temperature, but it is generally in a preferably range between 50° C. and 90° C. A higher temperature than such range is likely to provide a tackiness of the thermally conductive resin sheet member, and also to lead to excessive progress of the cure of the thermosetting resin.

It is noted that the pressure upon pressing is not particularly limited as long as the thermally conductive resin sheet member having the predetermined thickness is formed. The pressure is usually in a range between 2 MPa and 20 MPa. When the pressure is lower than such range, it may be difficult to control to give a constant thickness to the thermally conductive resin sheet member due to insufficient pressure. On the other hand, when the pressure is larger than such range, the plates have to be sufficiently strong and also a pressing machine should have large durability, which is practically disadvantageous. Pressing is carried out with a pressure preferably in the range between 6 MPa and 15 MPa and for example 10 MPa for a time period in the range usually between 10 seconds and 100 seconds, preferably 20 seconds and 60 seconds and for example 30 seconds.

It is noted that after the production of the thermally conductive resin sheet member having the predetermined shape, the viscosity of the thermally conductive resin sheet member is preferably not larger than 20000 Pa.s, and more preferably in the range between 1000 Pa.s and 20000 Pa.s. When the viscosity is greater than 20000 Pa.s, the thermally conductive resin sheet member may be hard so that it may be difficult to control the sheet thickness upon pressing. That is, because of the high viscosity, shape change of the sheet member is unlikely to occur so that the predetermined thickness cannot be achieved if the pressing pressure is low, or if the pressing pressure is high so as to obtain the predetermined thickness, breakage of the sheet member itself may occur. When the viscosity of the thermally conductive resin sheet member is too low upon pressing, maintenance of the sheet shape is not easy.

When the thermally conductive resin sheet member of which thickness has been controlled is formed into the predetermined shape (for example, when punching out is carried out as described above), the thermally conductive resin sheet member is preferably heated to a temperature which is lower than the curing temperature of the thermosetting resin contained in the thermally conductive resin sheet member, and for example to a temperature in the range between 40° C. and 90° C. Such heating decreases the viscosity of the thermally conductive resin sheet member so that punching out becomes easy which avoids cracking or breaking of the thermally conductive resin sheet member. At a temperature higher than such temperature range, the thermally conductive resin sheet member is likely to have the tackiness, which makes punching out difficult.

FIGS. 4(a) to 4(d) show the steps of another production process of the thermally conductive resin sheet member which is used for the production of the thermally conductive resin sheet member attached to the lead frame according to the present invention. In FIG. 3, a single thermally conductive resin sheet member is formed to have the predetermined shape. FIG. 4 is different from FIG. 3 in that a plurality of the thermally conductive resin sheet members are stacked together followed by pressing them to obtain a single thermally conductive resin sheet member 403 which, as a whole, has the predetermined thickness. Then the resulting thermally conductive resin sheet member 403 is formed into the thermally conductive resin sheet member 404 having the predetermined shape as in the above embodiment.

In the embodiment shown in FIG. 4, a thick thermally conductive resin sheet member 403 can be obtained by laminating a plurality of the thermally conductive resin sheet members 401 even though each of them has a relatively small thickness. Therefore, as to a thermally conductive resin sheet member having a large thickness which could not be obtained without laminating a plurality of the thermally conductive resin sheet members, only a single time pressing can conveniently control the thickness and an amount of the thermally conductive resin sheet member.

It is noted that upon stacking the plurality of thermally conductive resin sheet members 401, they are preferably arranged such that back surfaces and front surfaces thereof are oriented systematically (namely, as to each of the thermally conductive resin sheet members, its back surface is facing downward in the arrangement, or front surface is facing upward in the arrangement). The front surface of the thermally conductive resin sheet member is an exposed surface when a film member to be the member is formed on a substrate using the thermosetting resin mixture, and the bottom surface is a surface which is in contact with the substrate upon such formation. Staking in such arrangement, possible slight differences in a composition and an amount of the remaining solvent of the thermally conductive resin sheet member between the front surface and the back surface can substantially be averaged, and a front surface and a back surface of the produced integrated thermally conductive resin sheet member can be easily identified.

In each of the above embodiments, a release film is provided on each of the upper and lower main surfaces of the thermally conductive resin sheet member when it is sandwiched and pressed by the pair of plates or provided on each of the uppermost and lowermost surfaces of a whole body produced by stacking the plurality of thermally conductive resin sheet members. The release film prevents the thermally conductive resin sheet member having a controlled thickness from bonding to the plate, and makes it easy to remove the sheet member from the space between the plates. As such parting film, a release film which is the same as those used for the production of the thermally conductive resin sheet member may be used.

Embodiment 3

FIGS. 5(a) to 5(d) schematically show the steps of another production process of the thermally conductive resin sheet member attached to the lead frame according to the present invention. As to the materials and the conditions to be used, the details as described above are applicable unless specifically explained.

Figure 5:
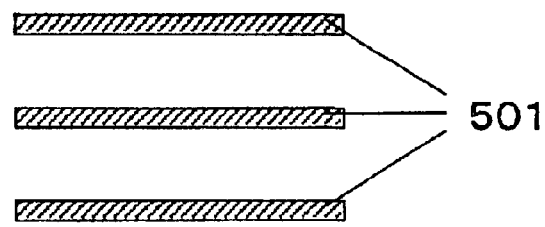
FIGS. 5(a) to 5(d) schematically show cross-sectional views of steps of another embodiment of a production process of a lead frame attached to a thermally conductive resin sheet member according to the present invention.
Figure 5:
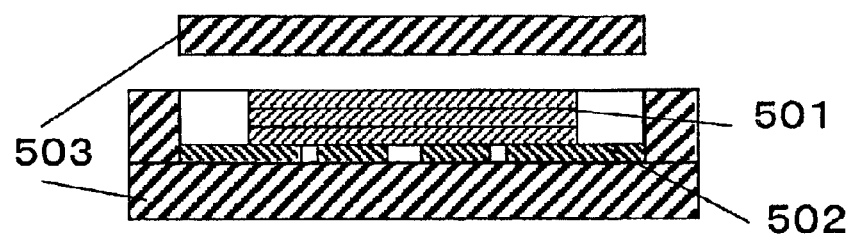
Figure 5:
Figure 5:

A plurality of the thermally conductive resin sheet members 501 each of which gel time has been adjusted as shown in FIG. 5(*a*) are stacked on the lead frame 502 as shown in FIG. 5(*b*) and placed between a pair of the plates 503 which are designed so that they approach each other so that the spacing between the plates becomes a predetermined spacing. Then, the plates are allowed to approach the predetermined spacing at a temperature which does not allow the cure of the thermosetting resin contained in the thermally conductive resin sheet member 501 to proceed, so that the thermally conductive resin sheet members 501 and the lead frame 502 are pressed.

By doing so as described above, the thermally conductive resin sheet member 501 which is integrated with the lead frame 502 is produced as shown in FIG. 5(*c*). It is noted that the plurality of the thermally conductive resin sheet members are integrated together as shown, and such state is shown in FIGS. 5(*c*) and 5(*d*). In addition, curing of the thermosetting resin contained in the thermally conductive resin sheet member has not substantially proceeded, so that the adjusted gel time has not been substantially changed.

In this embodiment, the thermally conductive resin sheet member not only fills the through-openings of the lead frame but also is bonded to the lead frame. In addition, a thickness of the integrated product of the lead frame and the thermally conductive resin sheet member is simultaneously controlled to be the predetermined thickness. It is noted that a peripheral portion of the lead frame and an edge portion of the thermally conductive resin sheet member are not concerned with the thickness control. Thereafter, only the thermally conductive resin sheet member 501 is processed into the predetermined shape so that the thermally conductive resin sheet member attached to the lead frame is produced such that an amount (size) of the thermally conductive resin sheet member has been controlled.

In this embodiment, the plurality of the thermally conductive resin sheet members have been stacked and integrated with the lead frame while the thickness control has been carried out. However, the number of the thermally conductive resin sheet members may be one, and in this case, a similar thermally conductive resin sheet member attaching to the lead frame is obtained.

Embodiment 4

Figure 6:
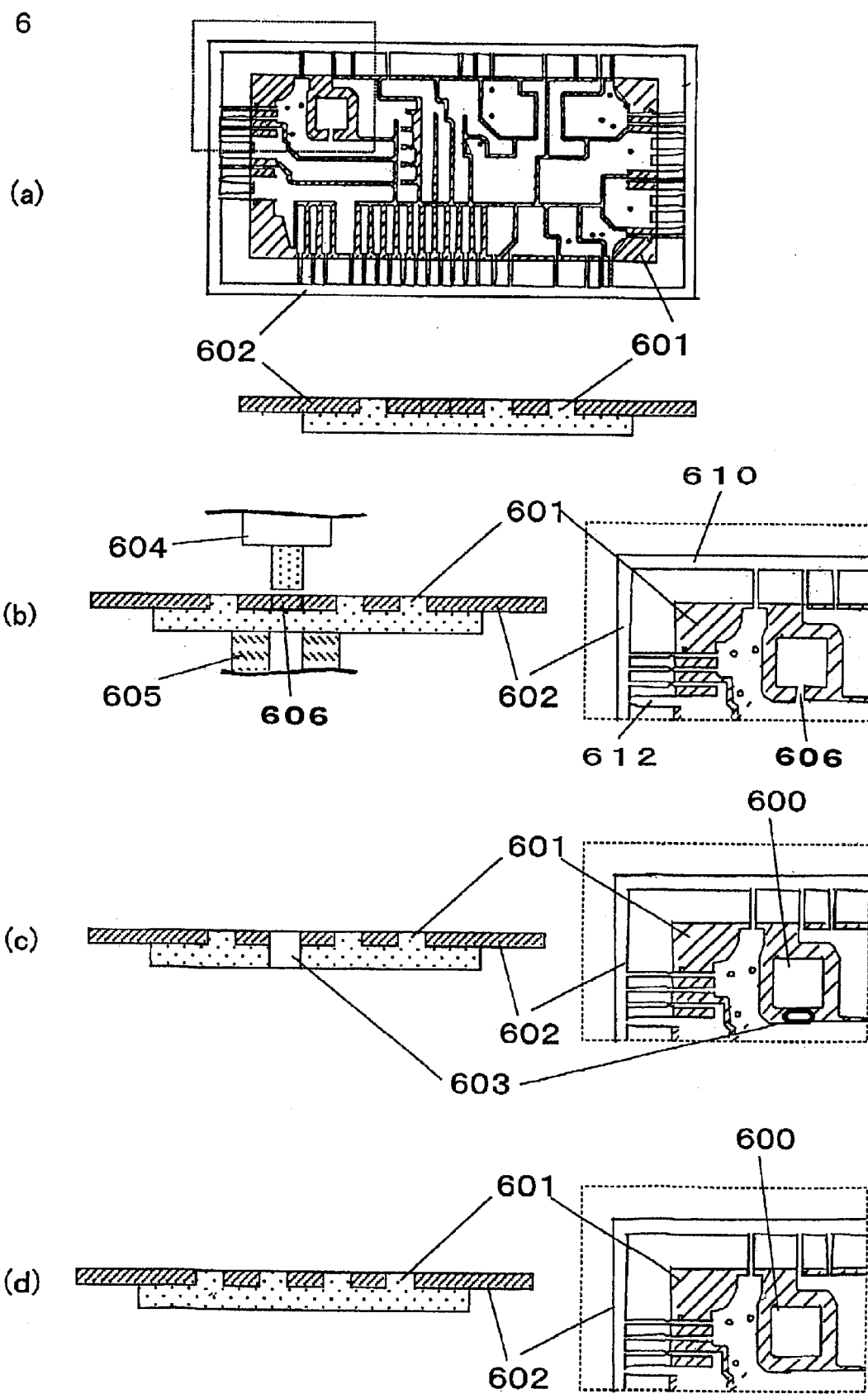
FIGS. 6(a) to 6(d) schematically show cross-sectional views and top views of steps of a further embodiment of a production process of a lead frame attached to a thermally conductive resin sheet member according to the present invention.

FIGS. 6(*a*) to 6(*d*) schematically show cross-sectional views and top views of steps of a further embodiment of the production process of the lead frame attached to the thermally conductive resin sheet member according to the present invention. As to the materials and the conditions to be used, the details as described above are applicable unless specifically explained. It is noted that the top views of FIGS. 6(*b*) to 6(*d*) show one possible embodiment of the area of the thermally conductive resin sheet member attached to the lead frame surrounded by the dotted line in FIG. 6(*a*).

FIG. 6(*a*) shows the thermally conductive resin sheet member attached to the lead frame which is produced by any one of the processes as described above wherein the thermally conductive resin sheet member 601 of which thermosetting resin is in the semi-cured state fills the lead frame 602 up to its surface and is integrated with the lead frame 602. In the shown lead frame 602, the outer frame portion 610 can function as an outermost common terminal, and each circuit pattern or each terminal which belongs to the pattern is ultimately connected to the outermost common terminal through a common terminal 612

The outer frame portion 610 is cut off together with a portion of each common terminal 612 of the periphery of the lead frame which terminal leads to the outer frame portion after the heat dissipation metal plate is integrated thereafter with the thermally conductive resin sheet member attaching lead frame. Therefore, a remaining portion of each common terminal 612 of the periphery of the lead frame which terminal extends outward becomes an output electrode of the thermally conductive substrate. Since all of the circuit patterns are electrically (and thus also mechanically) connected to the outer frame portion 610 through the common terminals 612, and the lead frame is integrated with the thermally conductive resin sheet member except the outer frame portion 610 and a portion of each common terminal of the lead frame, falling off of any terminal or circuit pattern of the lead frame is prevented, which improves handling of the lead frame. It is noted that in FIG. 6(*a*), each common terminal 612 of the lead frame is connected to the outer frame portion 610, to which the present invention is not limited, and the lead frame may be of another form.

In FIG. 6, the lead frame 602 is located over substantially all of the thermally conductive resin sheet member 601, but it is not always necessary that the lead frame be present an entirety of one main surface of the thermally conductive resin sheet member. Therefore, in another embodiment, the lead frame may be placed on a portion of one surface of the thermally conductive resin sheet member.

In a further embodiment of the lead frame which is integrated with the thermally conductive resin sheet member according to the present invention, a circuit pattern or a terminal which is electrically independent of the lead frame may be integrated with the thermally conductive resin sheet member on the same side thereof on which the lead frame is present. FIGS. 6(*b*) to FIG. 6(*d*) show the enlarged portion of FIG. 6(*a*) surrounded by the dotted line. The lead frame integrated with the thermally conductive resin sheet member according to the present invention may have a circuit pattern or a terminal 600 which is not electrically connected to any circuit pattern of the lead frame as shown in FIG. 6(*d*). The circuit pattern 600 present thus does not independently fall off the thermally conductive resin sheet member because of being held by the thermally conductive resin sheet member 601 even though it is electrically separated from the other circuit patterns as if it were an isolated island. Such non-falling off improves the handing thereof.

The isolated island like circuit pattern (or terminal) as described above may be one which is originated from a portion of the lead frame, and may be formed by processing the lead frame which has been integrated with the thermally conductive resin sheet member. Concretely, a portion of the lead frame which has been integrated with the thermally conductive resin sheet member is removed so as to leave a desired circuit pattern 600 in an isolated island-like form. Such removal may be carried out by punching out a portion of the lead frame 606 which is adjacent to the desired circuit pattern 600 together with a portion of the thermally conductive resin sheet member just below the former (punched out) portion of the lead frame using a pin 604 and a die 605 of a punching machine as shown in FIG. 6(*b*) so as to form a through-hole 603 as shown in FIG. 6(*c*). Although punching out is carried out using the punching machine herein, the removal is of course not limited to such a punching machine, and any other method may be optionally selected depending on a thickness of the thermally conductive resin sheet member attached to the lead frame, a diameter of a desired through-hole and so on. For example, a punching processing operation which uses a die, drilling processing, or the like may be employed. Such processing is preferable since it conveniently provides high positional accuracy.

It is noted that such processing of the lead frame as described above may be carried out in other embodiments. For example, the processing may be carried out by removing a portion of the lead frame after the step shown in FIG. 2(c). Further, when only a portion of the lead frame is, for example, mechanically cut off or removed by etching, a portion of the thermally conductive resin sheet member does not have to be removed.

In the embodiment shown in FIG. 6, heating and pressing of the thermally conductive resin sheet member attached to the lead frame under a condition which does not allow the cure of the semi-cured thermosetting resin to further proceed after the formation of the through-hole 603 as shown in FIG. 6(c) can fill the through-hole 603 with a portion of the thermally conductive resin sheet member which portion is present around the through hole 603 as shown in FIG. 6(d). In the thus-described manner, a thermally conductive resin sheet member is produced which is integrated with the lead frame while further comprising the circuit pattern or terminal which is electrically independent of the lead frame. In the above description, the portion of the thermally conductive resin sheet member around the through-hole is fluidized so as to fill the through-hole with the thermally conductive resin sheet member in the semi-cured state by pressing, to which filling is of course not limited. For example, a desired amount of the thermally conductive resin sheet member in a non-cured state or the semi-cured state, and preferably a small piece of such thermally conductive resin sheet member, is separately supplied to the through-hole followed by heating and pressing it under the condition which does not allow the cure.

Embodiment 5

FIGS. 7(a) to 7(d) schematically show cross-sectional views of steps of an embodiment of the production process of the thermally conductive substrate according to the present invention. As to the materials and the conditions to be used, the details as described above are applicable unless specifically explained.

Figure 7:
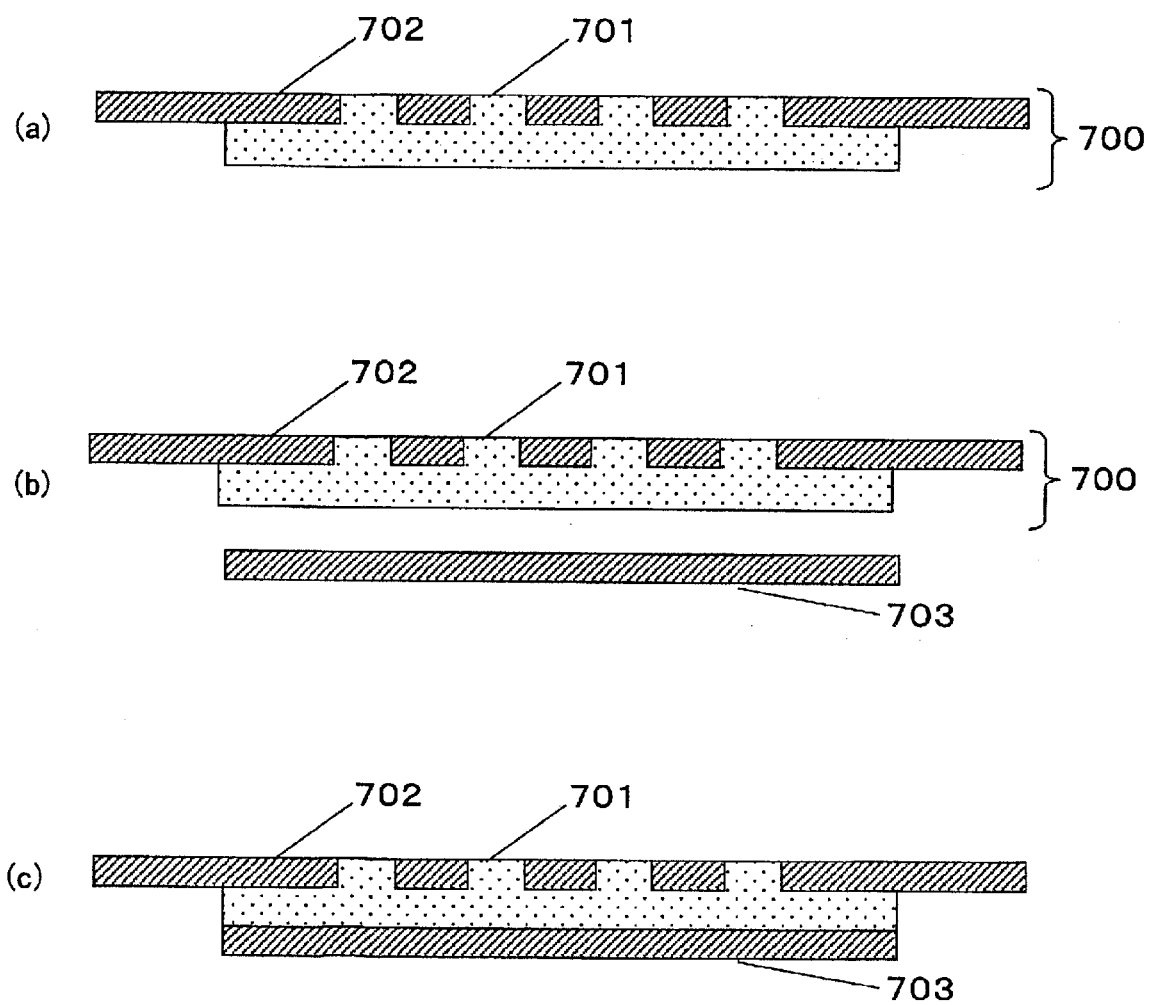
FIGS. 7(a) to 7(c) schematically show cross-sectional views of steps of one embodiment of a production process of a thermally conductive substrate according to the present invention.

FIG. 7(a) shows a thermally conductive resin sheet member attached to a lead frame 700 according to the present invention which is produced as in the steps of, for example, Embodiment 2 or Embodiment 3 as described above. The thermally conductive resin sheet member 701 in the semi-cured state fills the openings of the lead frame 702 up to its surface while it is integrated with the lead frame 702. It is noted that a thickness and thus an amount (size) per unit area of the thermally conductive resin sheet member has been preferably controlled as described with reference to FIGS. 3 and 4 and also explained in combination with Embodiment 3. More preferably, a volume of a single piece of the thermally conductive resin sheet member is predetermined. Also, the thermally conductive resin sheet member attached to the lead frame 700 may have the construction which has been explained in Embodiment 4 with reference to FIGS. 6(a) to 6(d).

As shown in FIG. 7(b), the heat dissipation metal plate 703 is stacked on and aligned with a surface of the thermally which surface is opposite to the lead frame 702. As a result, the lead frame 702 is opposed to the heat dissipation metal plate 703 through the thermally conductive resin sheet member 701. Then, these are thermally treated while pressing them so that the thermosetting resin contained in the thermally conductive resin sheet member is cured, whereby the heat dissipation metal plate 703 is bonded to and integrated with the thermally conductive resin sheet member attached to the lead frame 700 as shown in FIG. 7(c) so that the thermally conductive substrate is produced.

The thermal pressing as described above is preferably carried out in the following two separate steps. The first step involves thermally treating the thermally conductive resin sheet member attached to the lead frame 700 on which the heat dissipation metal plate 703 is stacked for a predetermined time period at a temperature not lower than a temperature which allows the cure of the thermosetting resin to proceed, and preferably a temperature not lower than the curing temperature without pressing. The second step involves pressing the resin sheet member, the lead frame, and the heat dissipation plate at a predetermined pressure while keeping their temperature or keeping them at a different temperature (which may be raised to a higher temperature or reduced to a lower temperature when necessary) so that the thermosetting resin is further cured (i.e., continuing the thermal treatment with pressing). It is noted that integrating the thermally conductive resin sheet member with the lead frame before the integration with the heat dissipation metal plate suppresses overflow of the thermosetting resin mixture over the surface of the lead frame in the production of the thermally conductive substrate by thermally pressing the heat dissipation metal plate stacked on the thermally conductive resin sheet member attached to the lead frame so that the suppression effect of the formation of the resin burrs and stains is provided.

Also, in the step of heating the thermally conductive resin sheet member attached to the lead frame on which the metal heat dissipation plate is stacked without pressing them for the predetermined time period at a temperature which is not lower than the temperature which allows the cure of the thermosetting resin to start, when an extent of the cure progress of the thermally conductive resin sheet member has been adjusted before pressing, an excessive flow of the thermosetting resin mixture onto the surface of the lead frame upon the pressing thereafter so that the suppression effect of the surface stains is provided.

The temperature of thermal treatment for the production of the thermally conductive substrate may be selected depending on the thermosetting resin to be used, but it is usually in the range between 100° C. and 230° C. When the temperature is lower than such range, curing may be insufficient, and when the temperature is higher than such range, the resin may be likely to start its decomposition. The preferable temperature in the range between 130° C. and 180° C., and for example 140° C. The pressure upon pressing is not particularly limited, but it is preferable that the pressure is in the range between 1 MPa and 20 MPa, and for example 14 MPa. When the pressure is lower than such range, bonding between the thermally conductive resin sheet member or the lead frame and the heat dissipation metal plate is insufficient so that delamination may be likely to occur. When the pressure is higher than such range, the substrate is likely to be broken. In the step of the thermal treatment without pressing, the time period of the thermal treatment is in a range usually between 1 second and 60 seconds, preferably between 5 seconds and 30 seconds, more preferably 10 seconds and 20 seconds and for example 15 seconds. Further, in the step of thermal treatment with pressing, the time period of the thermal treatment is in the range usually between 1 minute and 120 minutes, preferably between 5 minutes and 60 minutes, and more preferably 8 minutes and 30 minutes.

It is noted that there may be a case in which the cure extent of the thermosetting resin of the thermally conductive substrate as described above is not necessarily sufficient. In such case, the thermally conductive substrate obtained according to the above process can be further thermally treated so that the cure extent can be increased so as to substantially complete the cure.

Embodiment 6

FIGS. 8(a) to 8(e) schematically show cross-sectional views of steps of other embodiment of the production process of the thermally conductive substrate according to the present invention. As to the materials and the conditions to be used, the details as described above are applicable unless specifically explained.

Figure 8:
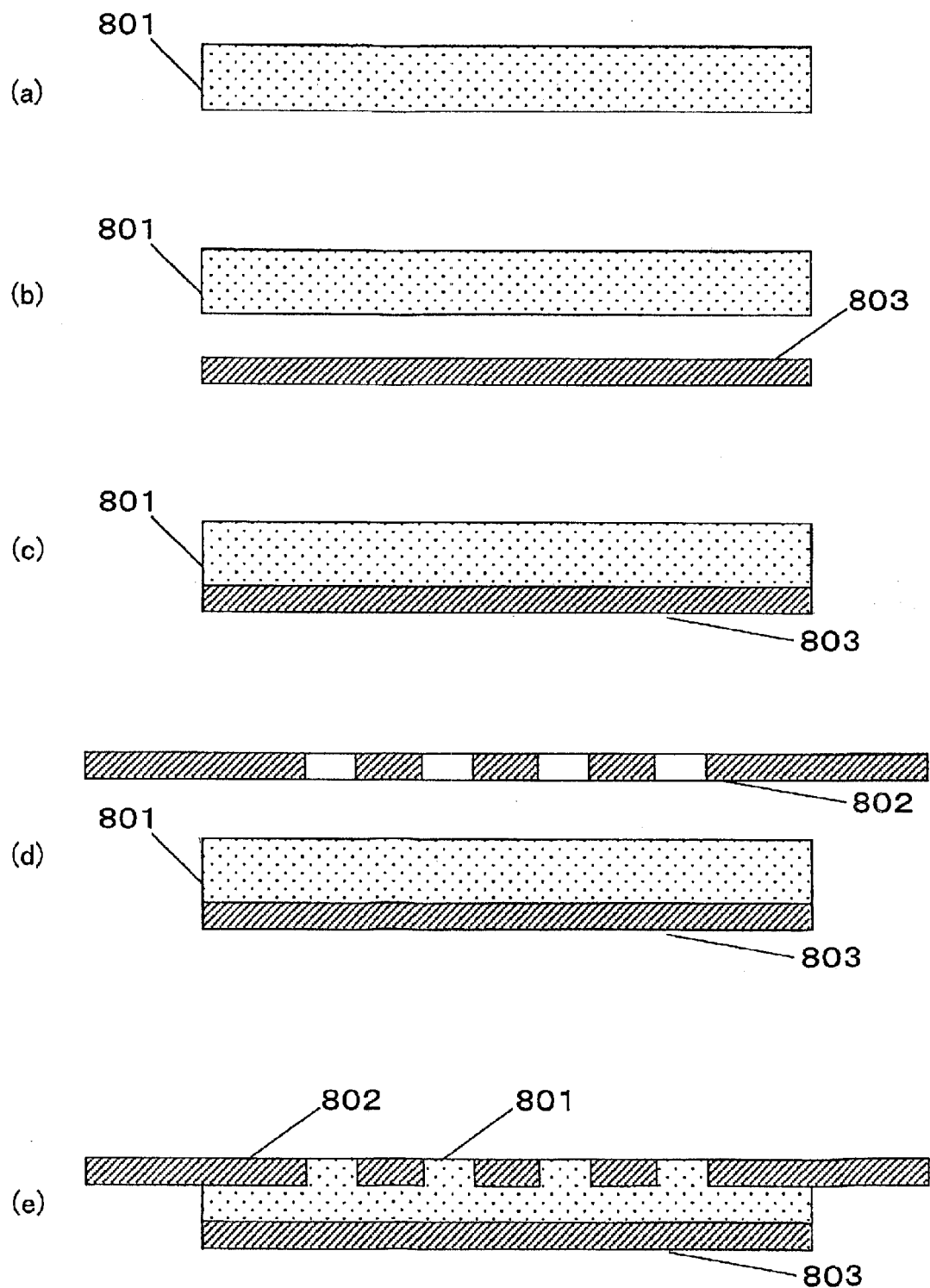
FIGS. 8(a) to 8(e) schematically show cross-sectional views of steps of another embodiment of a production process of a thermally conductive substrate according to the present invention.

FIG. 8(a) shows the thermally conductive resin sheet member 801, which has been adjusted by using, for example, a drying oven so as to have the predetermined gel time for the purpose of using the sheet. Therefore; the thermosetting resin contained in the thermally conductive resin sheet member is in the semi-cured state. It is noted that after such an adjusting step, the thus-obtained thermally conductive resin sheet member 801 is preferably processed to have a predetermined shape as described above. By doing so, a thickness and/or a weight of the thermally conductive resin sheet member can be controlled.

Then, the heat dissipation metal plate 803 and the thermally conductive resin sheet member 801 are stacked as shown in FIG. 8(b). Thereafter, they are thermally pressed as shown in FIG. 8(c) at a temperature which does not allow the cure of the thermally conductive resin sheet member in the semi-cured state to further proceed, so that the thermally conductive resin sheet member is press-bonded to (integrated with) the heat dissipation metal plate. The conditions for the temperature and the pressure at this stage may be the same as those for the integration of the lead frame with the thermally conductive resin sheet member for the production of the thermally conductive resin sheet member attached to the lead frame according to the present invention.

Then, as shown in FIG. 8(d), the lead frame 802 is placed on the thermally conductive resin sheet member with which the heat dissipation metal plate has been integrated. Therefore, the heat dissipation metal plate 803 is opposed to the lead frame 802 through the thermally conductive resin sheet member 801 while aligning them.

Thereafter, by thermally treating them while pressing, the through-openings of the lead frame 802 are filled with the thermally conductive resin sheet member 801 and the thermally conductive resin sheet member is integrated with the lead frame, so that the lead frame and the thermally conductive resin sheet member together form a single surface. Upon such thermal pressing, the heat dissipation metal plate 803 bonds to the thermally conductive resin sheet member more firmly to produce the integrated thermally conductive substrate, although the heat dissipation metal plate 803 has already been integrated with the thermally conductive resin sheet member 801. The thermal treatment at this stage may be carried out by initially thermally treating without pressing, and then pressing as described with reference to the integration with the heat dissipation metal plate in Embodiment 5. However, thermal treating and pressing may be carried out from the beginning. The conditions for the thermal treatment and the pressing may be the same as those for the integration with the heat dissipation metal plate in Embodiment 5 wherein the thermal treatment and the pressing are carried out together. Optionally, the resulting thermally conductive substrate may be further thermally treated so as to ensure sufficient cure of the thermally conductive resin sheet member.

EXAMPLES

The present invention will be hereinafter further explained in detail with reference to Examples.

Example 1

A thermally conductive resin sheet member which was used for this Example was produced. First, a thermosetting resin mixture in a slurry form was prepared by mixing an inorganic filler and a thermosetting resin as well as the following components, of which compositions are shown below:

| | |
|---|---|
| (1) Inorganic filler: $Al_2O_3$ (AS-40 having an average particle diameter of 12 μm, manufactured by Showa Denko) | 89 parts by weight |
| (2) Thermosetting resin: bromated polyfunctional epoxy resin (NVR-1010 containing a curing agent, manufactured by JAPAN REC CO., LTD.) | 10 parts by weight |
| (3) Other additives | |
| Curing accelerator (iminazole, manufactured by JAPAN REC CO., LTD.) | 0.05 parts by weight |
| Carbon black (manufactured by Toyo Carbon) | 0.4 parts by weight |
| Coupling agent (Plenact, manufactured by Ajinomoto) | 0.55 parts by weight |

MEK was added as a solvent in addition to the above components, and they were mixed with a kneader (manufactured by Matsuo-Sangyo). It is noted that a viscosity of the mixture was reduced by the addition of the MEK so that it was readily formed into a slurry, and the MEK was removed by evaporation thereof so that no amount of MEK is referred to above.

Using the slurry, a film of the slurry was formed in the doctor blade method on a release film made of a polyethylene terephthalate (PET), a surface of which was subjected to the release treatment. Thereafter, the film was dried at a temperature of 90° C. for 60 minutes so that the solvent was evaporated, whereby a thermally conductive resin sheet member (150 mm×150 mm) was obtained which had a thickness of 1.0 mm and which contained the thermosetting resin in the semi-cured state.

Then, a thermally conductive resin sheet member attached to a lead frame was formed. A lead frame was prepared by etching a copper plate having a thickness of 0.5 mm (manufactured by Kobe Steel) in a known etching technique so as to form a circuit pattern followed by nickel plating. Thereafter, one surface of the lead frame was roughened by sand blasting (abrasive powder: $Al_2O_3$, (Trade name: Morandom A-40) manufactured by Showa Denko).

Next, the thermally conductive resin sheet members obtained in the above process were thermally treated in a drying oven at a temperature of 100° C. By varying a time period of the thermal treatment variously, the thermally conductive resin sheet members were adjusted to have different gel times (Experiments "a" to "f"). It is noted that the temperature of the thermal treatment is a set temperature of the drying oven, and the time period of the thermal treatment is a period for which the thermally conductive resin sheet member was held in the drying oven.

A frame-like spacer having an outer size of 250 mm×250 mm, a thickness of 0.8 mm and a center through opening which had a size of 160 mm×160 mm was placed between two flat plates made of stainless steel SUS 304 (250 mm×250 mm), and the plates were heated to a temperature of 70° C. A PET film having a thickness of 75 m was place on a surface of each side of the thermally conductive resin sheet member of which gel time was adjusted, and then the thermally conductive resin sheet member was placed in the through opening. By making the flat plates approach each other, the thermally conductive resin sheet member was pressed with a pressure of 3 MPa for one minute. Thereafter, the thermally conductive resin sheet member was taken out to obtain the thermally conductive resin sheet member of which thickness was controlled. Then, the PET film was peeled off from one of the surfaces of the thermally conductive resin sheet member, from which a thermally conductive resin sheet member having a size of 100 mm×100 mm was stamped out using a die while keeping the thermally conductive resin sheet member at a temperature of 70° C. so that the thermally conductive resin sheet member having a controlled amount per unit area thereof was obtained. It is noted that substantially no cure of the thermosetting resin proceeded at a temperature of 70° C.

Next, the thus-obtained thermally conductive resin sheet member and the lead frame as described above were thermally pressed similarly to FIG. 2(b) at a temperature of 65° C. at a pressure of 10 MPa for 60 seconds. By doing so, the thermally conductive resin sheet member was flowed into pattern gaps, namely the through openings of the lead frame, so that the thermally conductive resin sheet member attached to the lead frame was obtained in which the thermally conductive resin sheet member filled the gaps in the surface of the lead frame and it was integrated with the lead frame as shown in FIG. 2(c). It is noted that the PET film (not shown) is bonded to the other surface of the thermally conductive resin sheet member.

Then, an aluminum plate having a thickness of 1 mm was provided as a metal heat dissipation metal plate, and both surfaces thereof were subjected to the sand blasting treatment as in the case of the lead frame. The release film was peeled off from the thermally conductive resin sheet member attached to the lead frame obtained as described above, and the heat dissipation metal plate and the thermally conductive resin sheet member attached to the lead frame were stacked while being aligned so that the lead frame and the heat dissipation metal plate were opposed via the thermally conductive resin sheet member as shown in FIG. 7(b).

First, the heat dissipation metal plate and the thermally conductive resin sheet member attached to the lead frame were heated at a temperature of 140° C. for 15 seconds, and then pressed at a pressure of 14 MPa for 10 minutes. By doing so, the thermosetting resin contained in the thermally conductive resin sheet member cured to be rigid, and the heat dissipation metal plate was bonded to the thermally conductive resin sheet member so that the thermally conductive substrate was obtained as shown in FIG. 7(c). In addition, the thermally conductive substrate was thermally treated thereafter at a temperature of 175° C. for 6 hours, whereby the cure of the thermosetting resin sufficiently proceeded so as to complete the thermally conductive substrate. Subsequently, a part is mounted onto the thermally conductive substrate after the steps of a soldering resist treatment, frame cutting, terminal processing and so on are completed. Since these steps can be carried out by known techniques and do not directly relate to the present invention, explanations thereof are omitted.

Using the various thermally conductive resin sheet members which have different gel times (Experiments "a" to "f"), they were integrated with the lead frames as described above. Then they were integrated with the heat dissipation metal plates, so that various thermally conductive substrates were obtained. The thus-obtained thermally conductive substrates were evaluated. Especially, a filling extent of the thermally conductive resin sheet member into the through-openings of the lead frame and the presence of the resin burrs and the stains on the exposed surface of the lead frame were visually inspected. Further, adhesion states of the lead frame and the heat dissipation metal plate were evaluated by observing an interface between the thermally conductive resin sheet member and the lead frame or the heat dissipation metal plate in each of the thermally conductive substrates using a Scan Acoustic Tomograph (SAT) apparatus. It is noted that the gel time was obtained by sampling a portion of the thermally conductive resin sheet member from the obtained thermally conductive resin sheet member attached to the lead frame and measuring the gel time at a temperature of 155° C. Results are shown in Table 1 below:

TABLE 1

|  | "a" | "b" | "c" | "d" | "e" | "f" |
|---|---|---|---|---|---|---|
| thermal treatment time period (min.) | 40 | 35 | 30 | 20 | 10 | 5 |
| gel time of thermally conductive resin sheet member (sec.) | 10 | 20 | 70 | 120 | 180 | 240 |
| filling extent of thermally conductive resin sheet member into lead frame | X | good | good | good | good | good |
| adhesion states of lead frame and heat dissipation metal plate | X | good | good | good | good | good |
| resin burrs and surface stains on lead frame | none | none | none | none | many | too many |

It is noted that "X", "many" and "too many" are used as evaluation indexes in the Table, and they resulted from relative comparisons (that is, they merely mean that they are relatively not good), though it does not always mean that a thermally conductive substrate having a relatively not good evaluation cannot be used for any of the applications thereof.

When the gel time of the thermally conductive resin sheet member at a stage of the thermally conductive resin sheet member attached to the lead frame is short, the curing reaction has proceeded excessively. Therefore, the thermally conductive resin sheet member did not flow into the pattern gaps (through openings) so that the gaps were not sufficiently filled up to the surface of the lead frame upon the integration with the lead frame. In addition, the adhesion state with the heat dissipation metal plate was not necessarily sufficient upon the integration with the heat dissipation metal plate.

On the other hand, when the gel time of the thermally conductive resin sheet member is long, the exudation of the thermosetting resin mixture onto the peripheries of the thermally conductive substrate and particularly onto the exposed surface of the lead frame was accelerated, so that the resin burrs and the surface stains were increased. Especially, it was confirmed that when the gel time at a temperature of 155° C. of the thermally conductive resin sheet member at the stage of the thermally conductive resin sheet member attached to the lead frame was in the range between 20 seconds and 150 seconds, the filling extent into the openings of the lead frame, the adhesion state of the lead frame and the adhesion state of the metal heat dissipation plate were particularly good, and also the formation of the surface stains and the resin burrs was slight.

Therefore, when the gel time of the thermally conductive resin sheet member is in the above-mentioned range, particularly in the range between 50 seconds and 90 seconds, very good thermally conductive substrates can be produced. Further, re-flow tests were carried out at a maximum temperature of 260° C. for ten seconds as reliability evaluation tests of thus produced substrates (having a gel time in the range between 20 seconds and 120 seconds). After completion of such tests, there was nothing wrong at the interface between the thermally conductive resin sheet member and the lead frame and the metal plate, which confirms that strong adhesions were maintained.

Figure 9:
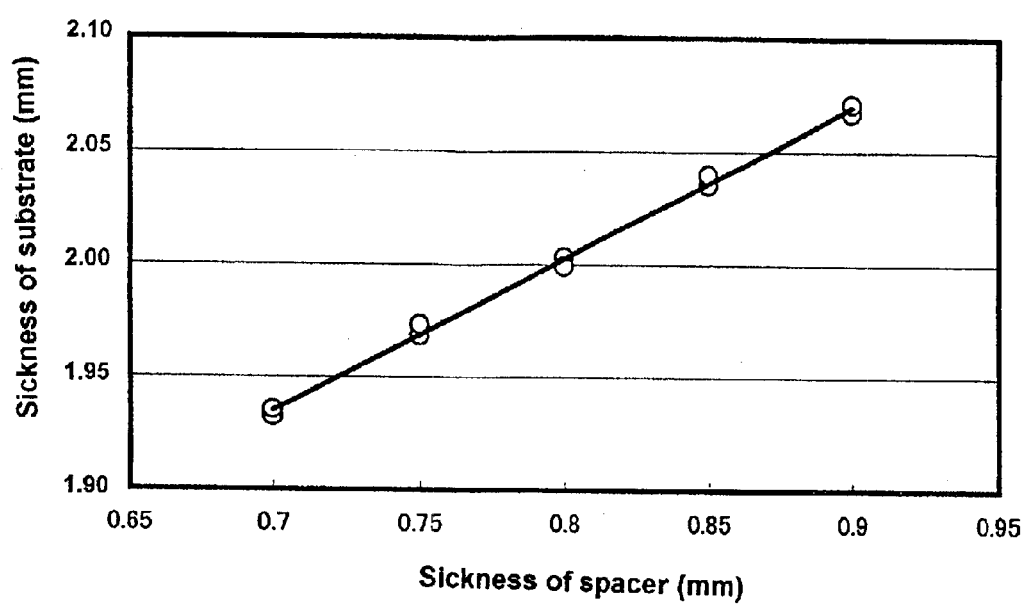
FIG. 9 is a graph which shows a relationship between a thickness of a thermally conductive substrate produced in one example of the present invention and a thickness of a spacer used for such production.

By varying the thickness of the spacer variously upon the production of the thermally conductive substrates as described above, various thermally conductive substrates were produced of which thermally conductive resin sheet members had various thicknesses. The thickness of the center portion of each thermally conductive substrate was measured by a micrometer. A relationship between the thickness of the spacer and the measured thickness of the substrate is shown in FIG. 9. As seen from FIG. 9, the thickness, and thus an amount (size) of the thermally conductive resin sheet member, can be accurately controlled by varying the thickness of the spacer, so that the thermally conductive substrate of which thickness and thus weight per single sheet is stable can be produced.

Example 2

Using the thermosetting resin mixture having a composition which was the same as that in Example 1, a thermally conductive resin sheet member having a thickness of about 0.4 mm was produced on a PET film as in Example 1. Then, the thermally conductive resin sheet member was thermally treated in a drying oven at a temperature of 100° C. so that it had a gel time of 60 seconds.

Three sheets of such thermally conductive resin sheet member were prepared, and the PET films were removed from two of the sheets. The sheets were stacked as shown in FIG. 4(b) while the back surface of the thermally conductive resin sheet member was in contact with the front surface of the other thermally conductive resin sheet member, and a PET film was further placed on the uppermost surface. They were placed in a mold which was able to press those sheets between a pair of plates heated to a temperature of 60° C. while keeping a predetermined gap, followed by pressing at a pressure of 5 MPa, so that an integrated thermally conductive resin sheet member having a controlled thickness was obtained as shown in FIG. 4(c). Thereafter, by stamping out a section into a predetermined size using a die, the thermally conductive resin sheet member of which the amount (size) was controlled was obtained as shown in FIG. 4(d).

Next, a circuit pattern was prepared by stamping it out from a 42-alloy (42 % Ni—Fe alloy) plate having a thickness of 0.5 mm so that a lead frame was prepared which was plated with nickel as well as a solder. One surface of the lead frame was roughened in the same maanner as in Example 1.

The lead frame was thermally pressed with the thus-obtained thermally conductive resin sheet member as shown in FIG. 2(b) at a temperature of 65° C. and a pressure of 10 MPa for 60 seconds, whereby a thermally conductive resin sheet member attached to the lead frame was obtained. It is noted that the PET film was attached to the surface of the thermally conductive resin sheet member.

Next, an aluminum plate having a thickness of 1 mm was prepared as a heat dissipation metal plate, and both surfaces thereof were subjected to the sand blasting treatment as with the lead frame. Then, the release film was removed from the thermally conductive resin sheet member attaching lead frame obtained as described, the thermally conductive resin sheet member attaching lead frame was overlapped with the aluminum plate such that the lead frame and the aluminum plate are opposed to each other through the thermally conductive resin sheet member as shown in FIG. 7(b).

First, they were heated at a temperature of 140° C. for 15 seconds followed by pressing under a pressure of 14 MPa for 10 minutes, so that a thermally conductive substrate having a thickness of about 2.5 mm was obtained as shown in FIG. 7(c). In addition, the thermally conductive substrate was subjected to the thermal treatment thereafter at a temperature of 175° C. for 6 hours, whereby a final thermally conductive substrate of which thermosetting resin was sufficiently cured was obtained.

The adhesion states of the lead frame and the aluminum plate at the interfaces of the obtained thermally conductive substrate were evaluated by SAT, and no delamination was observed at the interfaces. Further, a thermal cycling test between −55° C. and 125° C. was carried out for 1000 cycles, after which the adhesion states at the interfaces were evaluated, and no delamination was observed. It has been confirmed based on these results that the thermally conductive substrate produced by the process according to the present invention has a high reliability.

Example 3

A thermally conductive resin sheet member which was used for this Example was formed. First, a thermosetting resin mixture in a slurry form was prepared by mixing an inorganic filler and a thermosetting resin as well as the following components, of which compositions are shown below:

| | |
|---|---|
| (1) Inorganic filler: $Al_2O_3$ (AS-40 having an average particle diameter size of 12 μm, manufactured by Showa Denko) | 88 parts by weight |
| (2) Thermosetting resin: epoxy resin (XNR5002, manufactured by Nagase-CIBA Ltd.) | 11.5 parts by weight |
| (3) Other additives | |
| Silane based coupling agent (A-187, manufactured by Nippon Unicar Co., Ltd.) | 0.3 parts by weight |
| Carbon black (manufactured by Toyo Carbon) | 0.2 parts by weight |

The above components were blended and a small amount of MEK was further added thereto so as to reduce the viscosity, followed by kneading them using a kneader (manufactured by Matsuo-Sangyo) and additionally kneading using a kneader having three rolls, and then by vacuum drying so as to remove MEK so that a thermosetting resin mixture in a clay-like form is obtained. The thermosetting resin mixture was extruded onto a release film made of a polyethylene terephthalate (PET) which was subjected to the release treatment so that a thermally conductive resin sheet member was obtained which had a thickness of 1.2 mm.

Thereafter, the obtained thermally conductive resin sheet member was thermally treated in a drying oven at a temperature of 125° C. for 50 minutes followed by cooling to room temperature so that a gel time of the thermally conductive resin sheet member was adjusted to 70 seconds.

Next, a lead frame was prepared by stamping it out of a copper plate having a thickness of 0.8 mm so that the lead frame had a wiring pattern. The lead frame was stacked on the thus-obtained thermally conductive resin sheet member (in this Example, only a single piece thereof) as shown in FIG. 5(b), which was pressed in a mold having iron plates under a pressure of 4 MPa which were able to approach each other to form a predetermined gap between them and which were heated to a temperature of 50° C. Thus, a thermally conductive resin sheet member was obtained as shown in FIG. 5(c) of which thickness was controlled and which was integrated with the lead frame. Then, the thermally conductive resin sheet member was formed into a predetermined shape as shown in FIG. 5(d) by cutting off unnecessary portions of the thermally conductive resin sheet member while heating it to a temperature of 60° C.

Thereafter, a copper plate having a thickness of 3 mm was placed on the obtained thermally conductive resin sheet member attached to the lead frame, followed by heating them to a temperature of 140° C. for 15 seconds without pressing and then by pressing with a pressure of 14 MPa for 10 minutes, whereby a thermally conductive substrate having a thickness of 4.5 mm was obtained as shown in FIG. 7(c). Then, the thermally conductive substrate was thermally treated further at a temperature of 175° C. for 6 hours so that the cure of the thermosetting resin proceeded so as to complete the thermally conductive substrate.

Evaluations similar to those in Example 2 were carried out, and substantially the same results were obtained. It has been confirmed that based on these results, the thermally conductive substrate produced by the process according to the present invention has a high reliability.

Example 4

Using a thermosetting resin mixture having the same composition as in Example 3, a thermally conductive resin sheet member having a thickness of about 1.2 mm was prepared on a PET film in the same manner as in Example 1. Then, the thermally conductive resin sheet member was thermally treated in the drying oven at a temperature of 125° C. so as to adjust the gel time thereof to 70 seconds.

An aluminum plate having a thickness of 1 mm was prepared as a heat dissipation metal plate and both surfaces thereof were subjected to the roughening treatment as in Example 1. Then, the heat dissipation metal plate was placed against the thus-obtained thermally conductive resin sheet member as shown in FIG. 8(b) followed by thermally pressing them at a temperature of 75° C. with a pressure of 10 MPa for 5 minutes. The heating was carried out in a vacuum condition (having a pressure of $1 \times 10^{-4}$ MPa) so as to avoid formation of voids.

By doing so, a thermally conductive resin sheet attached to the aluminum plate as shown in FIG. 8(c) was obtained wherein the thermally conductive resin sheet member was press bonded to the heat dissipation metal plate. It is noted that the PET film was still attached to the surface of the thermally conductive resin sheet member.

Next, a lead frame was prepared by etching a copper plate having a thickness of 0.5 mm (manufactured by Kobe Steel) in a known technique so as to form a circuit pattern followed by nickel plating. Thereafter, one surface of the lead frame was roughened in the same manner as in the case of the aluminum plate.

The release film was removed from the thermally conductive resin sheet attached to the aluminum plate obtained as described above, and the aluminum plate and the lead frame were stacked and aligned through the thermally conductive resin sheet member as shown in FIG. 8(d), which were pressed with a pressure of 14 MPa at a temperature of 175° C. for 10 minutes. By doing so, the thermally conductive resin sheet member filled the pattern gaps of the lead frame so as to form a single surface together with the lead frame and also cured so that a thermally conductive substrate having a thickness of 2.5 mm (a thickness of an insulation layer is 1.0 mm) to which the heat dissipation metal plate was bonded was obtained as shown in FIG. 8(e).

Thereafter, the thermal treatment was further carried out at a temperature of 175° C. for 6 hours so as to allow the cure of the thermosetting resin to proceed, and the thermally conductive substrate was completed. The substrate thus produced had few resin burrs and surface stains, and the visible and SAT observations showed nothing particularly wrong as to the interface between the thermally conductive resin sheet member and the lead frame or the heat dissipation metal plate, which confirmed that strong adhesion was achieved. Further, the re-flow tests were carried out as a reliability test, and nothing particularly wrong was observed.

On the other hand, as a comparative example, when a similar thermally conductive resin sheet member which was not subjected to the thermal treatment (i.e., without adjusting a gel time) was cured so as to integrate with the aluminum plate, followed by integrating with the lead frame, curing of the thermally conductive resin sheet member was insufficient upon the thermally pressing for 10 minutes for the purpose of integrating with the lead frame, and it took at least 30 minutes for sufficient curing.

Therefore, it became possible to make a time period for the curing of the thermally conductive resin sheet member short by thermally treating a plurality of the thermally conductive resin sheet members together so as to adjust their gel times beforehand which were appropriate for the production of the thermally conductive substrate, so that the production "Takt" of the thermally conductive substrate could be shortened.

As described above, due to the production of the thermally conductive resin sheet member attached to the lead frame comprising the thermally conductive resin sheet member, the lead frame and the heat dissipation metal plate, the formation of the resin burrs and the surface stains due to the exudation of the thermosetting resin mixture can be suppressed by using the thermally conductive resin sheet member attaching lead frame according to the present invention. Also, due to the adjustment of the gel time prior to the production of the thermally conductive substrate, many thermally conductive resin sheet members can be thermally treated together, which shortens a time period for curing the thermally conductive resin sheet member carried out by means of heating it in a later step, so that it becomes possible to shorten the production "Takt" of the thermally conductive substrate and also to suppress the formation of the resin burrs and the surface stains on the surfaces of the lead frame and the metal heat dissipation plate. Further, it is possible to produce the thermally conductive substrate having a stable thickness by pressing the thermally conductive resin sheet member of which gel time has been controlled so as to have a uniform thickness and thus to control an amount of the thermally conductive resin sheet member per unit area thereof.

In addition, the thermally conductive resin sheet member which has just been just (thus, before the adjustment of the gel time) still has a long gel time, so that such thermally conductive resin sheet member can be stored for an extended period. Since the gel time adjustment can be carried out as to many of the thermally conductive resin sheet members together, the production "Takt" of the thermally conductive substrate is improved overall so that the thermally conductive substrate having the good heat dispassion and the high reliability can be produced.

It is noted that the thermally conductive substrate (which may be referred to as "thermally conducting substrate") is a substrate made of a material which includes the filler for the purpose of the heat conduction as seen from the above description, and the thermally conductive substrate usually has the wiring pattern on one surface of the substrate and the heat dissipation metal plate on the other surface. Further, the thermally conductive resin sheet member is a sheet form member which is used for the production of such a thermally conductive substrate, and the thermally conductive resin sheet member is obtained by curing a sheet material made of the thermosetting resin mixture.

What is claimed is:

1. A thermally conductive substrate comprising:
   a thermally conductive resin sheet member formed of a thermosetting resin mixture, said thermosetting resin mixture including 70 to 90 parts by weight of an inorganic filler and 5 to 30 parts by weight of a thermosetting resin composition comprising a thermosetting resin in a semi-cured state; and
   a lead frame integrated with said thermally conductive resin sheet member.

2. The thermally conductive substrate of claim 1, wherein said thermally conductive resin sheet member has a gel time in a range between 20 seconds and 120 seconds at a temperature of 155° C.

3. The thermally conductive substrate of claim 2, wherein said thermally conductive resin sheet member has a viscosity in a range between 102 Pa.s and 105 Pa.s.

4. The thermally conductive substrate of claim 2, wherein said lead frame includes a through-opening, said through-opening being filled with said thermally conductive resin sheet member so that said thermally conductive resin sheet member and said lead frame are integrated to form a flush surface.

5. The thermally conductive substrate of claim 2, wherein said thermosetting resin composition includes at least one component selected from a group consisting of a bisphenol A epoxy resin, a bisphenol F epoxy resin, and a liquid phenol resin.

6. The thermally conductive substrate of claim 2, wherein said inorganic filler comprises at least one material selected from a group consisting of $Al_2O_3$, MgO, BN and AlN.

7. The thermally conductive substrate of claim 2, wherein said thermally conductive resin sheet member is integrated with a portion of said lead frame, said lead frame including an outer frame portion connected to a common terminal, and including a second terminal electrically connected to said outer frame portion through said common terminal.

8. The thermally conductive substrate of claim 2, wherein said lead frame is located on a first side of said thermally conductive resin sheet member, said thermally conductive resin sheet member including at least one terminal on said first side, said at least one terminal being electrically independent of said lead frame.

9. The thermally conductive substrate of claim 1, wherein said thermally conductive resin sheet member has a viscosity in a range between 102 Pa.s and 105 Pa.s.

10. The thermally conductive substrate of claim 1, wherein said lead frame includes a through-opening, said through-opening being filled with said thermally conductive resin sheet member so that said thermally conductive resin sheet member and said lead frame are integrated to form a flush surface.

11. The thermally conductive substrate of claim 1, wherein said thermosetting resin composition includes at least one component selected from a group consisting of a bisphenol A epoxy resin, a bisphenol F epoxy resin, and a liquid phenol resin.

12. The thermally conductive substrate of claim 1, wherein said inorganic filler comprises at least one material selected from a group consisting of $Al_2O_3$, MgO, BN and AlN.

13. The thermally conductive substrate of claim 1, wherein said thermally conductive resin sheet member is integrated with a portion of said lead frame, said lead frame including an outer frame portion connected to a common terminal, and including a second terminal electrically connected to said outer frame portion through said common terminal.

14. The thermally conductive substrate of claim 1, wherein said lead frame is located on a first side of said thermally conductive resin sheet member, said thermally conductive resin sheet member including at least one terminal on said first side, said at least one terminal being electrically independent of said lead frame.

* * * * *

UNITED STATES PATENT AND TRADEMARK OFFICE
CERTIFICATE OF CORRECTION

PATENT NO.      : 6,870,244 B2  
DATED           : March 22, 2005  
INVENTOR(S)     : Yoshihisa Yamashita et al.

It is certified that error appears in the above-identified patent and that said Letters Patent is hereby corrected as shown below:

<u>Title page,</u>
Item [57], ABSTRACT,
Line 7, should read -- resin mixture which comprises 70 to 90 parts by weight of an --.

Signed and Sealed this

Second Day of August, 2005

JON W. DUDAS
*Director of the United States Patent and Trademark Office*